US008395231B2

(12) United States Patent
Terashima

(10) Patent No.: US 8,395,231 B2
(45) Date of Patent: Mar. 12, 2013

(54) SEMICONDUCTOR DEVICE SUPPLYING CHARGING CURRENT TO ELEMENT TO BE CHARGED

(75) Inventor: Tomohide Terashima, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 1028 days.

(21) Appl. No.: 11/831,496

(22) Filed: Jul. 31, 2007

(65) Prior Publication Data

US 2008/0224736 A1    Sep. 18, 2008

(30) Foreign Application Priority Data

Mar. 13, 2007    (JP) .................................. 2007-063711

(51) Int. Cl.
*H01L 21/70* (2006.01)
*H01L 21/762* (2006.01)

(52) U.S. Cl. .. 257/500; 257/501; 257/524; 257/E21.564

(58) Field of Classification Search .................. 257/630, 257/354, 648
See application file for complete search history.

(56) References Cited

U.S. PATENT DOCUMENTS

| | | | |
|---|---|---|---|
| 5,497,023 A | | 3/1996 | Nakazato et al. |
| 5,545,911 A | | 8/1996 | Otsuki et al. |
| 5,767,562 A | * | 6/1998 | Yamashita ..................... 257/500 |
| 5,801,418 A | | 9/1998 | Ranjan |
| 5,874,767 A | | 2/1999 | Terashima et al. |
| 5,949,664 A | * | 9/1999 | Bernet et al. ..................... 363/37 |
| 6,124,628 A | * | 9/2000 | Fujihira et al. ................. 257/630 |
| 6,329,260 B1 | * | 12/2001 | DeJong et al. ................. 438/318 |
| 6,586,780 B1 | * | 7/2003 | Terashima ..................... 257/140 |

(Continued)

FOREIGN PATENT DOCUMENTS

| | | |
|---|---|---|
| JP | 6-188372 | 7/1994 |
| JP | 9-162298 | 6/1997 |

(Continued)

OTHER PUBLICATIONS

Kiyoto Watabe, et al., "A Half-Bridge Driver IC with Newly Designed High Voltage Diode", Proceedings of the 13th International Symposium on Power Semiconductor Devices & ICs, ISPSD '01, Jun. 4-7, 2001, 5 Pages.

*Primary Examiner* — Zandra Smith
*Assistant Examiner* — Tsz Chiu
(74) *Attorney, Agent, or Firm* — Oblon, Spivak, McClelland, Maier & Neustadt, L.L.P.

(57) ABSTRACT

A semiconductor device supplying a charging current to a charging-target element includes: a semiconductor layer of a first conductivity type; a first semiconductor region of a second conductivity type formed on a main surface of the semiconductor layer and having a first node coupled to a first electrode of the charging-target element and a second node coupled to a power supply potential node supplied with a power supply voltage; a second semiconductor region of the first conductivity type formed in a surface of the first semiconductor region at a distance from the semiconductor layer and having a third node coupled to the power supply potential node; and a charge carrier drift restriction portion restricting drift of charge carrier from the third node to the semiconductor layer.

19 Claims, 27 Drawing Sheets

U.S. PATENT DOCUMENTS

| | | | |
|---|---|---|---|
| 6,707,101 B2 * | 3/2004 | Ranjan | 257/339 |
| 6,825,700 B2 | 11/2004 | Hano | |
| 2004/0070027 A1 * | 4/2004 | Neilson et al. | 257/327 |
| 2004/0125619 A1 * | 7/2004 | Yang et al. | 363/21.01 |
| 2006/0043475 A1 | 3/2006 | Terashima | |
| 2007/0063293 A1 | 3/2007 | Terashima | |
| 2007/0115705 A1 * | 5/2007 | Gotzenberger et al. | 363/132 |
| 2008/0143265 A1 * | 6/2008 | Nagase et al. | 315/169.4 |
| 2008/0239759 A1 * | 10/2008 | Nakahori | 363/20 |

FOREIGN PATENT DOCUMENTS

| | | |
|---|---|---|
| JP | 2004-47937 | 2/2004 |
| JP | 2006-5182 | 1/2006 |

\* cited by examiner

SEMICONDUCTOR DEVICE SUPPLYING CHARGING CURRENT TO ELEMENT TO BE CHARGED

BACKGROUND OF THE INVENTION

1. Field of the Invention

The present invention relates to a semiconductor device, and more particularly to a semiconductor device supplying a charging current to an element to be charged (hereinafter, also referred to as a charging-target element).

2. Description of the Background Art

A semiconductor device driving a power semiconductor element such as an IGBT (Insulated Gate Bipolar Transistor) has been developed. In such a semiconductor device, for example, a floating circuit is used as a circuit for driving a power semiconductor element which experiences great potential fluctuation. In order to supply a voltage to the floating circuit, for example, a bootstrap scheme has been adopted, in which a capacitor connected to a power supply voltage with a diode being interposed is employed as a power supply (see, for example, Japanese Patent Laying-Open Nos. 06-188372, 2006-005182 and 2004-047937 (Patent Documents 1 to 3) and Kiyoto Watabe et al., "A Half-Bridge Driver IC with Newly Designed High Voltage Diode," Proceedings of The 13th International Symposium on Power Semiconductor Devices & ICs, ISPSD '01, Jun. 4-7, 2001, Osaka International Convention Center, JAPAN (Non-Patent Document 1)).

According to the configuration described in Patent Documents 1 to 3, however, an n-type diffusion region serving as a path of the charging current from the power supply to the capacitor is narrowed by extension of a depletion layer, and therefore, the charging current becomes smaller.

Meanwhile, Non-Patent Document 1 fails to suggest prevention of power loss caused as a result that holes injected from a p-type diffusion region to an n-type diffusion region, the p-type diffusion region and the n-type diffusion region constituting the diode, flow toward a p⁻ type substrate not toward the capacitor.

SUMMARY OF THE INVENTION

An object of the present invention is to provide a semiconductor device capable of efficiently supplying a charging current to an element to be charged.

A semiconductor device according to one aspect of the present invention is directed to a semiconductor device supplying a charging current to a charging-target element, including: a semiconductor layer of a first conductivity type; a first semiconductor region of a second conductivity type formed on a main surface of the semiconductor layer and having a first node coupled to a first electrode of the charging-target element and a second node coupled to a power supply potential node supplied with a power supply voltage; a second semiconductor region of the first conductivity type formed in a surface of the first semiconductor region at a distance from the semiconductor layer and having a third node coupled to the power supply potential node; and a charge carrier drift restriction portion restricting drift of charge carrier from the third node to the semiconductor layer.

In addition, a semiconductor device according to yet another aspect of the present invention is directed to a semiconductor device supplying a charging current to a charging-target element, including: a semiconductor layer of a first conductivity type; a first semiconductor region of a second conductivity type formed on a main surface of the semiconductor layer and having a first node coupled to a first electrode of the charging-target element; a second semiconductor region of the first conductivity type formed in a surface of the first semiconductor region at a distance from the semiconductor layer and having a third node and a fourth node coupled to a power supply potential node supplied with a power supply voltage; and a charge carrier drift restriction portion restricting drift of charge carrier from the third node and the fourth node to the semiconductor layer.

In addition, a semiconductor device according to yet another aspect of the present invention is directed to a semiconductor device supplying a charging current to a charging-target element, including: a resistor having a first end coupled to a power supply potential node supplied with a power supply voltage; a first transistor having a first conducting electrode coupled to a second end of the resistor, a second conducting electrode coupled to a ground potential node supplied with a ground voltage, and a control electrode coupled to a first electrode of the charging-target element; and a second transistor having a first conducting electrode coupled to the power supply potential node, a second conducting electrode coupled to the first electrode of the charging-target element, and a control electrode coupled to the second end of the resistor.

According to the present invention, the charging current can efficiently be supplied to the element to be charged.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
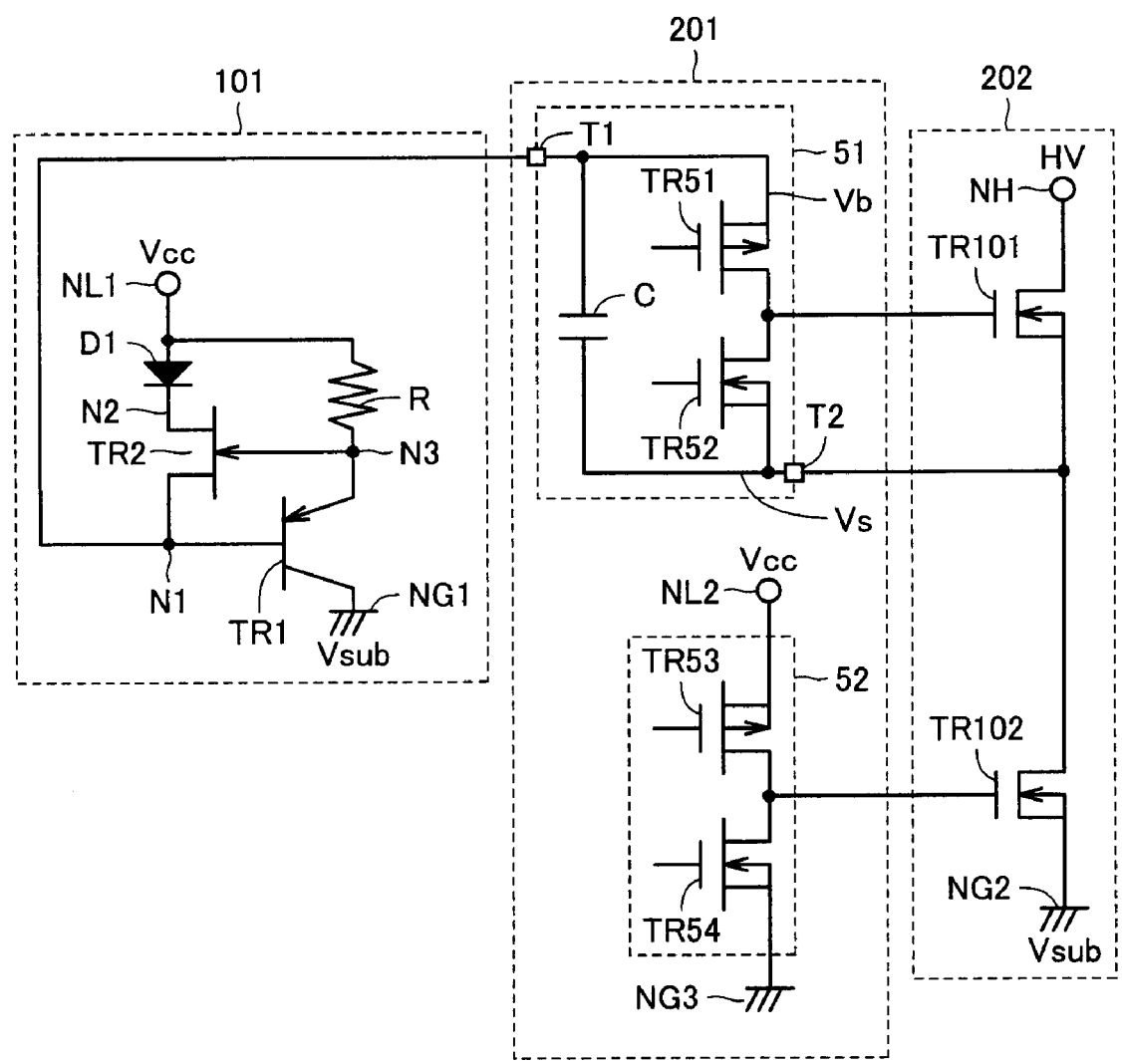
FIG. 1 is a circuit diagram showing a configuration of a semiconductor device according to Embodiment 1 of the present invention.

An embodiment of the present invention will be described hereinafter with reference to the drawings. It is noted that the same or corresponding elements have the same reference characters allotted, and description thereof will not be repeated.

Embodiment 1

[Configuration and Basic Operation]

FIG. 1 is a circuit diagram showing a configuration of a semiconductor device according to Embodiment 1 of the present invention.

Referring to FIG. 1, a semiconductor device 101 includes a PNP transistor TR1, a junction field-effect transistor (JFET) TR2, a diode D1, and a resistor (charge carrier drift restriction portion) R.

A drive device 201 includes a high-voltage side drive circuit 51 and a low-voltage side drive circuit 52. High-voltage side drive circuit 51 includes a P-channel MOS transistor TR51, an N-channel MOS transistor TR52, a capacitor (charging-target element) C, a power supply voltage terminal T1, and a reference voltage terminal T2. Low-voltage side drive circuit 52 includes a P-channel MOS transistor TR53 and an N-channel MOS transistor TR54.

A power conversion device 202 includes a high-voltage side power semiconductor element TR101 and a low-voltage side power semiconductor element TR102.

It is noted that drive device 201 may include a bipolar transistor instead of the MOS transistor. Alternatively, semiconductor device 101 may further include capacitor C, high-voltage side drive circuit 51, drive device 201, or drive device 201 and power conversion device 202.

Power supply potential nodes NL1 and NL2 are supplied with a power supply voltage Vcc. A high-voltage node HV is supplied with a high voltage HV, for example, of several hundred volts. Ground potential nodes NG1 to NG3 are supplied with a ground voltage Vsub.

Resistor R has a first end connected to power supply potential node NL1. Diode D1 has an anode connected to power supply potential node NL1. PNP transistor TR1 has an emitter (conducting electrode) connected to a second end of resistor R, a collector (conducting electrode) connected to ground potential node NG1, and a base (control electrode) connected to a first electrode of capacitor C. Junction field-effect transistor TR2 has the drain (conducting electrode) connected to a cathode of diode D1, the source (conducting electrode) connected to the first electrode of capacitor C, and the gate (control electrode) connected to the second end of resistor R.

Capacitor C has the first electrode connected to power supply voltage terminal T1 of high-voltage side drive circuit 51, and a second electrode connected to reference voltage terminal T2 of high-voltage side drive circuit 51. More specifically, P-channel MOS transistor TR51 has the source connected to the first electrode of capacitor C, and the drain connected to the drain of N-channel MOS transistor TR52 and the gate of high-voltage side power semiconductor element TR101. N-channel MOS transistor TR52 has the source connected to the second electrode of capacitor C.

High-voltage side drive circuit 51 has reference voltage terminal T2 connected to a connection point of high-voltage side power semiconductor element TR101 and low-voltage side power semiconductor element TR102 connected in series.

In low-voltage side drive circuit 52, P-channel MOS transistor TR53 has the source connected to power supply potential node NL2, and the drain connected to the drain of N-channel MOS transistor TR54 and the gate of low-voltage side power semiconductor element TR102. P-channel MOS transistor TR54 has the source connected to ground potential node NG3.

High-voltage side power semiconductor element TR101 has the drain connected to a high-voltage node NH. Low-voltage side power semiconductor element TR102 has the source connected to ground potential node NG2.

High-voltage side drive circuit 51 supplies a voltage to the gate of high-voltage side power semiconductor element TR101 based on a control voltage supplied to the gate of each of P-channel MOS transistor TR51 and N-channel MOS transistor TR52. Low-voltage side drive circuit 52 supplies a voltage to the gate of low-voltage side power semiconductor element TR102 based on a control voltage supplied to the gate of each of P-channel MOS transistor TR53 and N-channel MOS transistor TR54.

Figure 2:
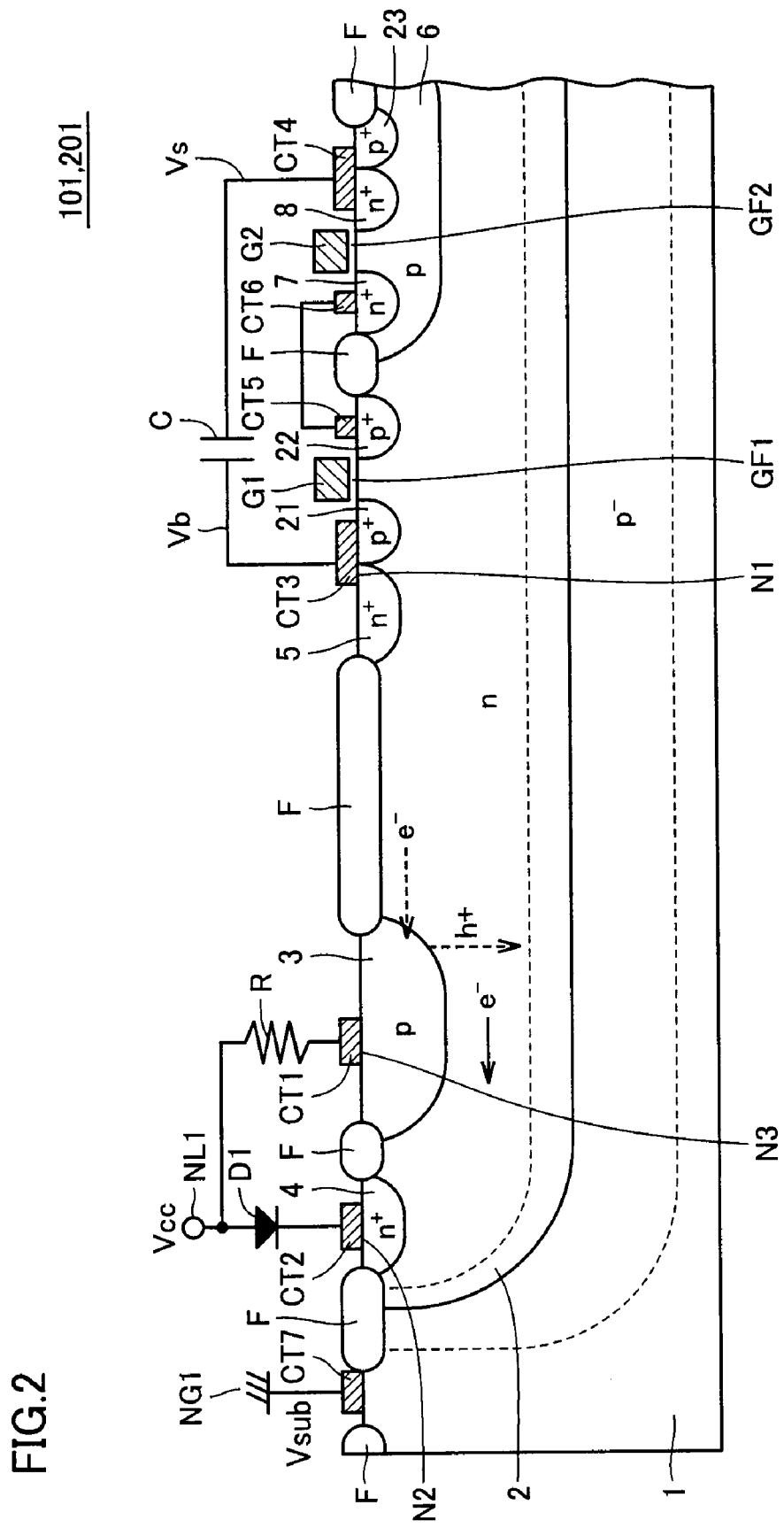
FIG. 2 is a cross-sectional view showing the configuration of the semiconductor device according to Embodiment 1 of the present invention.

FIG. 2 is a cross-sectional view showing the configuration of the semiconductor device according to Embodiment 1 of the present invention.

Referring to FIG. 2, semiconductor device 101 includes a p⁻ type substrate (semiconductor layer) 1, an n-type diffusion region (first semiconductor region) 2, a p-type diffusion region (second semiconductor region) 3, n⁺ type diffusion regions 4 and 5, a p-type diffusion region 6, n⁺ type diffusion regions 7 and 8, resistor R, diode D1, contacts CT1 to CT7, p⁺ type diffusion regions 21 to 23, gate electrodes G1 and G2, gate insulating films GF1 and GF2, and an oxide film F.

A dotted line in FIG. 2 indicates a boundary of a depletion layer extending from a junction surface between p⁻ type substrate 1 and n-type diffusion region 2.

P⁻ type substrate 1 is connected to ground potential node NG1 through contact CT7. N-type diffusion region 2 is formed on a main surface of p⁻ type substrate 1.

P-type diffusion region 3 is formed in the surface of n-type diffusion region 2 at a distance from the main surface of p⁻ type substrate 1. P-type diffusion region 3 has a node N3 coupled to power supply potential node NL1.

N⁺ type diffusion region 4 is formed in the surface of n-type diffusion region 2 at a distance from the main surface of p⁻ type substrate 1 and p-type diffusion region 3. N⁺ type diffusion region 4 has a node N2 coupled to power supply potential node NL1. Namely, n⁺ type diffusion region 4 is connected to power supply potential node NL1 through contact CT2 and diode D1.

N⁺ type diffusion region 5 is formed in the surface of n-type diffusion region 2 at a distance from the main surface of p⁻ type substrate 1, p-type diffusion region 3, and n⁺ type diffusion region 4. N⁺ type diffusion region 5 has a node N1 coupled to the first electrode of capacitor C. Namely, n⁺ type diffusion region 5 is connected to the first electrode of capacitor C through contact CT3.

Here, semiconductor device 101 may not include n⁺ type diffusion regions 4 and 5. In this case, n-type diffusion region 2 has node N1 coupled to the first electrode of capacitor C and node N2 coupled to power supply potential node NL1.

Resistor R has the first end connected to power supply potential node NL1 and the second end connected to p-type diffusion region 3 through contact CT1. Resistor R restricts drift of holes (charge carrier) from node N3 to p⁻ type substrate 1.

PNP transistor TR1 has a collector formed of p⁻ type substrate 1, a base formed of n-type diffusion region 2, and an emitter formed of p-type diffusion region 3. PNP transistor TR1 supplies the charging current to capacitor C through n-type diffusion region 2.

Junction field-effect transistor TR2 has the gate formed of n-type diffusion region 2 and p-type diffusion region 3, the drain formed of n-type diffusion region 2 and coupled to power supply potential node NL1 through node N2, and the source formed of n-type diffusion region 2 and coupled to the first electrode of capacitor C through node N1. Junction field-effect transistor TR2 supplies the charging current to capacitor C through n-type diffusion region 2.

Diode D1 has a cathode (n-type electrode) connected to the drain of junction field-effect transistor TR2 through contact CT2 and an anode (p-type electrode) connected to power supply potential node NL1 and the first end of resistor R.

P⁺ type diffusion region 21 is formed in the surface of n-type diffusion region 2 at a distance from the main surface of p⁻ type substrate 1, p-type diffusion region 3, and n⁺ type diffusion region 4. P⁺ type diffusion region 21 is connected to the first electrode of capacitor C through contact CT3.

P⁺ type diffusion region 22 is formed in the surface of n-type diffusion region 2 at a distance from the main surface of p⁻ type substrate 1, p-type diffusion region 3, n⁺ type diffusion regions 4 and 5, and p⁺ type diffusion region 21. P⁺ type diffusion region 22 is connected to n⁺ type diffusion region 7 through contacts CT5 and CT6.

P-channel MOS transistor TR51 has gate electrode G1 formed on the surface of n-type diffusion region 2 with gate insulating film GF1 being interposed, the source formed of p⁺ type diffusion region 21, and the drain formed of p⁺ type diffusion region 22. Gate electrode G1 is provided, opposed to a channel region in n-type diffusion region 2 lying between p⁺ type diffusion regions 21 and 22, with gate insulating film GF1 being interposed.

P-type diffusion region 6 is formed in the surface of n-type diffusion region 2 at a distance from the main surface of p⁻ type substrate 1, p-type diffusion region 3, n⁺ type diffusion regions 4 and 5, p⁺ type diffusion region 21, and p⁺ type diffusion region 22.

N⁺ type diffusion region 7 is formed in the surface of p-type diffusion region 6 at a distance from the main surface of p⁻ type substrate 1 and n-type diffusion region 2. N⁺ type diffusion region 7 is connected to p⁺ type diffusion region 22 through contacts CT5 and CT6.

N⁺ type diffusion region 8 is formed in the surface of p-type diffusion region 6 at a distance from the main surface of p⁻ type substrate 1, n-type diffusion region 2, and n⁺ type diffusion region 7. N⁺ type diffusion region 8 is connected to the second electrode of capacitor C through contact CT4.

N-channel MOS transistor TR52 has gate electrode G2 formed on the surface of p-type diffusion region 6 with gate insulating film GF2 being interposed, the drain formed of n⁺ type diffusion region 7, and the source formed of n⁺ type diffusion region 8. Gate electrode G2 is provided, opposed to a channel region in p-type diffusion region 6 lying between n⁺ type diffusion regions 7 and 8, with gate insulating film GF2 being interposed.

P⁺ type diffusion region 23 is formed in the surface of p-type diffusion region 6 at a distance from the main surface of p⁻ type substrate 1 and n⁺ type diffusion region 7. P⁺ type diffusion region 23 is connected to the second electrode of capacitor C through contact CT4.

P-type diffusion regions 3 and 6 have an impurity concentration higher than p⁻ type substrate 1. P⁺ type diffusion regions 21 to 23 have an impurity concentration higher than p-type diffusion regions 3 and 6. N⁺ type diffusion regions 4, 5, 7, and 8 have an impurity concentration higher than n-type diffusion region 2.

Semiconductor device 101 is designed to adapt to a power conversion circuit in which a withstand voltage, for example, of 600V is required. Here, the impurity concentration of p⁻ type substrate 1 is set in a range from $5\times10^{13}/cm^3$ to $5\times10^{14}/cm^3$, and power supply voltage Vcc is set, for example, in a range from 15V to 30V.

Strictly speaking, the gate electrode of junction field-effect transistor TR2 is formed of p⁻ type substrate 1 coupled to ground potential node NG1 and p-type diffusion region 3 coupled to power supply potential node NL1. As the impurity concentration of p-type diffusion region 3 is higher than that of p⁻ type substrate 1, however, influence of the depletion layer extending from p-type diffusion region 3 is greater than influence of the depletion layer extending from p⁻ type substrate 1. Therefore, for the sake of brevity, description is given assuming that the gate electrode of junction field-effect transistor TR2 is formed of p-type diffusion region 3 and n-type diffusion region 2.

[Operation]

An operation of the semiconductor device according to Embodiment 1 of the present invention when it charges capacitor C will now be described.

Power supply voltage Vcc is set, for example, to 15V, and high voltage HV is set, for example, to 300V. A potential Vs of reference voltage terminal T2 of high-voltage side drive circuit 51 varies, for example, in a range from 0V to 300V.

In addition, a potential Vb of power supply voltage terminal T1 of high-voltage side drive circuit 51 is higher than potential Vs by a voltage held by capacitor C.

Here, potential Vs repeatedly rises and lowers in response to a switching operation of high-voltage side power semiconductor element TR101 and low-voltage side power semiconductor element TR102. Accordingly, potential Vb also repeatedly rises and lowers in correspondence with potential Vs. In other words, potential Vb alternately repeats a state of Vb<Vcc and a state of Vb>Vcc.

Here, if potential Vb lowers and becomes lower than power supply voltage Vcc, PNP transistor TR1 turns on. Namely, a forward bias voltage is applied to a pn junction formed by p-type diffusion region 3 and n-type diffusion region 2. Then, holes are injected from p-type diffusion region 3 to n-type diffusion region 2. Namely, a current is supplied from power supply potential node NL1 to capacitor C through resistor R, p-type diffusion region 3, n-type diffusion region 2, and n$^+$ type diffusion region 5, thus charging capacitor C.

In addition, when potential Vb lowers and becomes lower than power supply voltage Vcc, junction field-effect transistor TR2 supplies a current to capacitor C. Namely, the current is supplied from power supply potential node NL1 to capacitor C through diode D1, n$^+$ type diffusion region 4, n-type diffusion region 2, and n$^+$ type diffusion region 5, thus charging capacitor C.

On the other hand, if potential Vb rises and exceeds power supply voltage Vcc, a reverse bias voltage is applied to the pn junction formed by p-type diffusion region 3 and n-type diffusion region 2. Accordingly, a reverse current from capacitor C to power supply potential node NL1 through n$^+$ type diffusion region 5, n-type diffusion region 2, p-type diffusion region 3, and resistor R is blocked.

In addition, when potential Vb rises and exceeds power supply voltage Vcc, a reverse bias voltage is applied to diode D1. Accordingly, the reverse current from capacitor C to power supply potential node NL1 through n$^+$ type diffusion region 5, n-type diffusion region 2, n type diffusion region 4, and diode D1 is blocked. Then, junction field-effect transistor TR2 pinches off before potential Vb further rises and reaches a breakdown voltage of diode D1. Namely, a current path is closed by the depletion layer extending in n-type diffusion region 2, so that the voltage applied to diode D1 is prevented from reaching the breakdown voltage.

Thus, each time potential Vb attains to power supply voltage Vcc or lower, capacitor C is charged. Therefore, capacitor C can serve as the power supply for high-voltage side drive circuit 51 serving as the floating circuit. In addition, the reverse current from capacitor C to power supply potential node NL1 can be blocked.

Here, in PNP transistor TR1 formed of p$^-$ type substrate 1, n-type diffusion region 2 and p-type diffusion region 3, the current from p-type diffusion region 3 to p$^-$ type substrate 1, which is the collector current, is greater than the current from p-type diffusion region 3 to capacitor C, which is the base current, by hFE (current amplification factor) of PNP transistor TR1. Namely, in charging capacitor C, most of holes injected from p-type diffusion region 3 to n-type diffusion region 2 flow toward p$^-$ type substrate 1. Accordingly, assuming that semiconductor device 101 does not include resistor R, even if a large amount of current flows from power supply potential node NL1 to contact CT1 during charging capacitor C, only a small amount of current reaches capacitor C. Therefore, power loss of the power supply supplying power supply voltage Vcc is considerably large.

The semiconductor device according to Embodiment 1 of the present invention, however, includes resistor R connected between power supply potential node NL1 and p-type diffusion region 3. According to such a configuration, the potential of contact CT1 is smaller than power supply voltage Vcc by an amount of voltage lowering in resistor R. Therefore, according to the semiconductor device in Embodiment 1 of the present invention, an amount of holes injected from p-type diffusion region 3 to n-type diffusion region 2 can be restricted and power loss of the power supply can be reduced.

Meanwhile, with such a configuration as simply including resistor R connected between power supply potential node NL1 and p-type diffusion region 3, an amount of holes that flow from power supply potential node NL1 into n-type diffusion region 2 through p-type diffusion region 3 is reduced by resistor R, and therefore, the charging current from power supply potential node NL1 to capacitor C becomes smaller.

In the semiconductor device according to Embodiment 1 of the present invention, however, n$^+$ type diffusion region 4 has node N2 coupled to power supply potential node NL1. According to such a configuration, as the charging current can be supplied from junction field-effect transistor TR2 formed of n-type diffusion region 2 and p-type diffusion region 3 to capacitor C through n-type diffusion region 2, the charging current from power supply potential node NL1 to capacitor C can be prevented from becoming smaller.

Here, it is assumed that semiconductor device 101 does not include resistor R and the potential of p-type diffusion region 3 is set to the ground potential as in the configuration described in Patent Documents 1 to 3. Here, even if potential Vb lowers and becomes smaller than power supply voltage Vcc, the reverse bias voltage is applied to the pn junction formed by p-type diffusion region 3 and n-type diffusion region 2, and therefore, the depletion layer extends from p-type diffusion region 3 in n-type diffusion region 2. Accordingly, an ON-state resistance of junction field-effect transistor TR2, that is, a resistance between contacts CT1 and CT3, becomes greater, and the charging current from junction field-effect transistor TR2 to capacitor C becomes smaller.

In the semiconductor device according to Embodiment 1 of the present invention, however, p-type diffusion region 3 is coupled to power supply potential node NL1. According to such a configuration, when potential Vb lowers and becomes lower than power supply voltage Vcc, the forward bias voltage is applied to the pn junction formed by p-type diffusion region 3 and n-type diffusion region 2, and therefore, the depletion layer can be prevented from extending from p-type diffusion region 3 in n-type diffusion region 2.

In addition, in the semiconductor device according to Embodiment 1 of the present invention, when potential Vb lowers and becomes lower than power supply voltage Vcc, the forward bias voltage is applied to the pn junction formed by p-type diffusion region 3 and n-type diffusion region 2, and therefore, holes are injected from p-type diffusion region 3 to n-type diffusion region 2. These injected holes cause conductivity modulation in n-type diffusion region 2. Namely, electrons concentrated in n-type diffusion region 2 cause higher conductivity of n-type diffusion region 2. Therefore, in the semiconductor device according to Embodiment 1 of the present invention, increase in the ON-state resistance of junction field-effect transistor TR2 can be prevented, and the charging current to capacitor C can be prevented from becoming smaller.

In the semiconductor device according to Embodiment 1 of the present invention, by adjusting a resistance value of resistor R, an amount of holes injected from p-type diffusion region 3 to n-type diffusion region 2 as well as the ON-state resistance of junction field-effect transistor TR2 can appropriately be set.

As described above, in the semiconductor device according to Embodiment 1 of the present invention, the charging current can efficiently be supplied to the charging-target element.

Another embodiment of the present invention will now be described with reference to the drawings. It is noted that the same or corresponding elements in the drawings have the same reference characters allotted, and description thereof will not be repeated.

Embodiment 2

The present embodiment relates to a semiconductor device different from the semiconductor device according to Embodiment 1 in additionally including a protection circuit. The semiconductor device in the present embodiment is the same as the semiconductor device according to Embodiment 1 except for the disclosure below.

Figure 3:
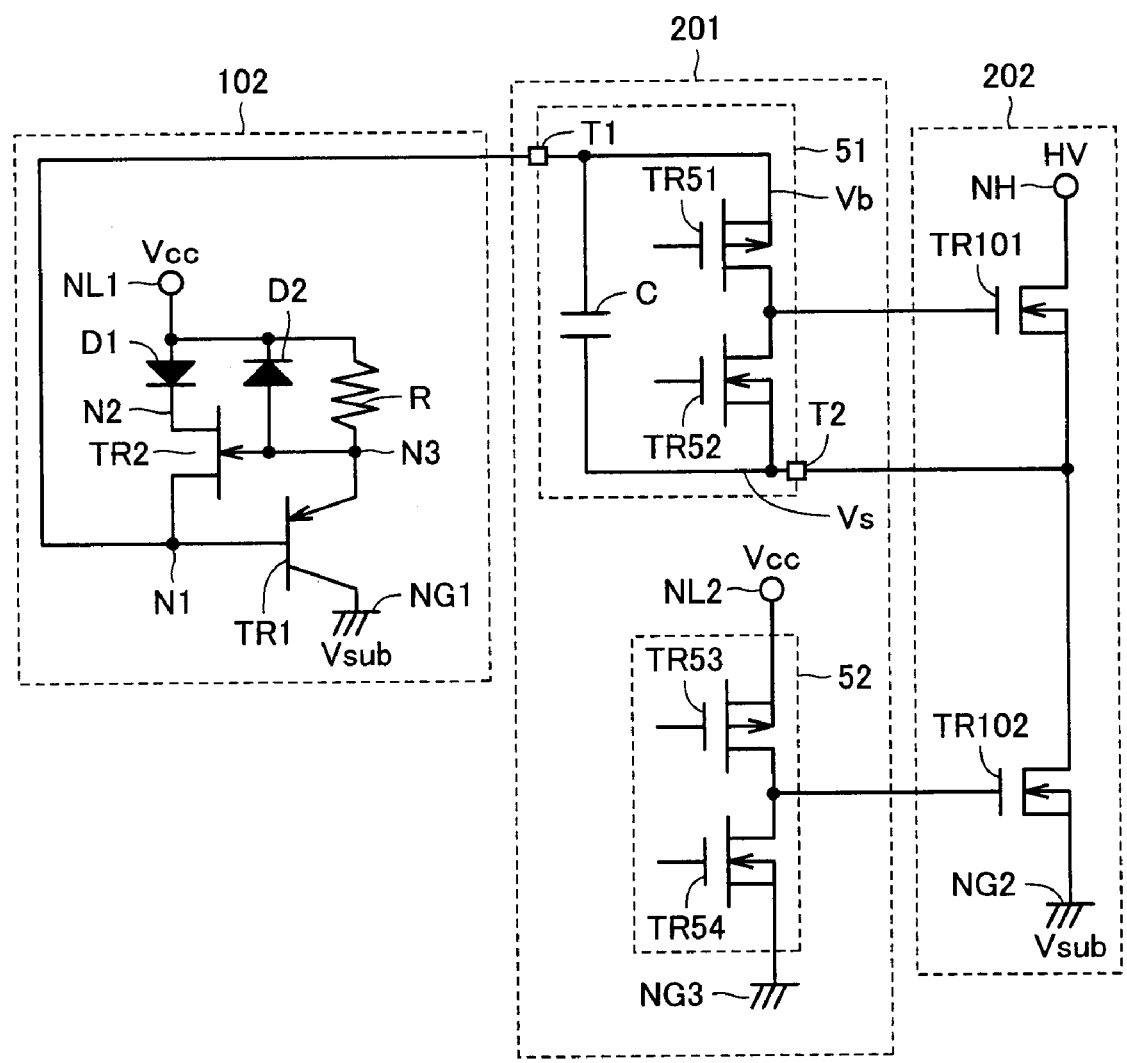
FIG. 3 is a circuit diagram showing a configuration of a semiconductor device according to Embodiment 2 of the present invention.

FIG. 3 is a circuit diagram showing a configuration of the semiconductor device according to Embodiment 2 of the present invention.

Referring to FIG. 3, a semiconductor device 102 is different from semiconductor device 101 according to Embodiment 1 of the present invention in further including a diode D2.

Diode D2 has an anode connected to p-type diffusion region 3, that is, the second end of resistor R, and a cathode connected to power supply potential node NL1.

Here, the drain of high-voltage side power semiconductor element TR101 is connected, for example, to a voltage of several hundred volts. In this case, potential Vs suddenly increases, for example, to several hundred volts in 1 microsecond in response to the switching operation of high-voltage side power semiconductor element TR101 and low-voltage side power semiconductor element TR102.

Accordingly, a displacement current flows through resistor R due to sudden increase in potential Vb and the potential of contact CT1 becomes significantly greater than power supply voltage Vcc, which may cause avalanche between $n^+$ type diffusion region 4 and p-type diffusion region 3.

In the semiconductor device according to Embodiment 2 of the present invention, however, diode D2 enters a forward bias state when potential Vb suddenly increases, and therefore, the potential of contact CT1 can be prevented from becoming greater than power supply voltage Vcc.

As the configuration and the operation are otherwise the same as those of the semiconductor device according to Embodiment 1, detailed description will not be repeated here.

Therefore, in the semiconductor device according to Embodiment 2 of the present invention, the charging current can efficiently be supplied to the charging-target element, as in the semiconductor device according to Embodiment 1 of the present invention.

Another embodiment of the present invention will now be described with reference to the drawings. It is noted that the same or corresponding elements in the drawings have the same reference characters allotted, and description thereof will not be repeated.

Embodiment 3

The present embodiment relates to a semiconductor device different from the semiconductor device according to Embodiment 1 in additionally including a transistor.

Figure 4:
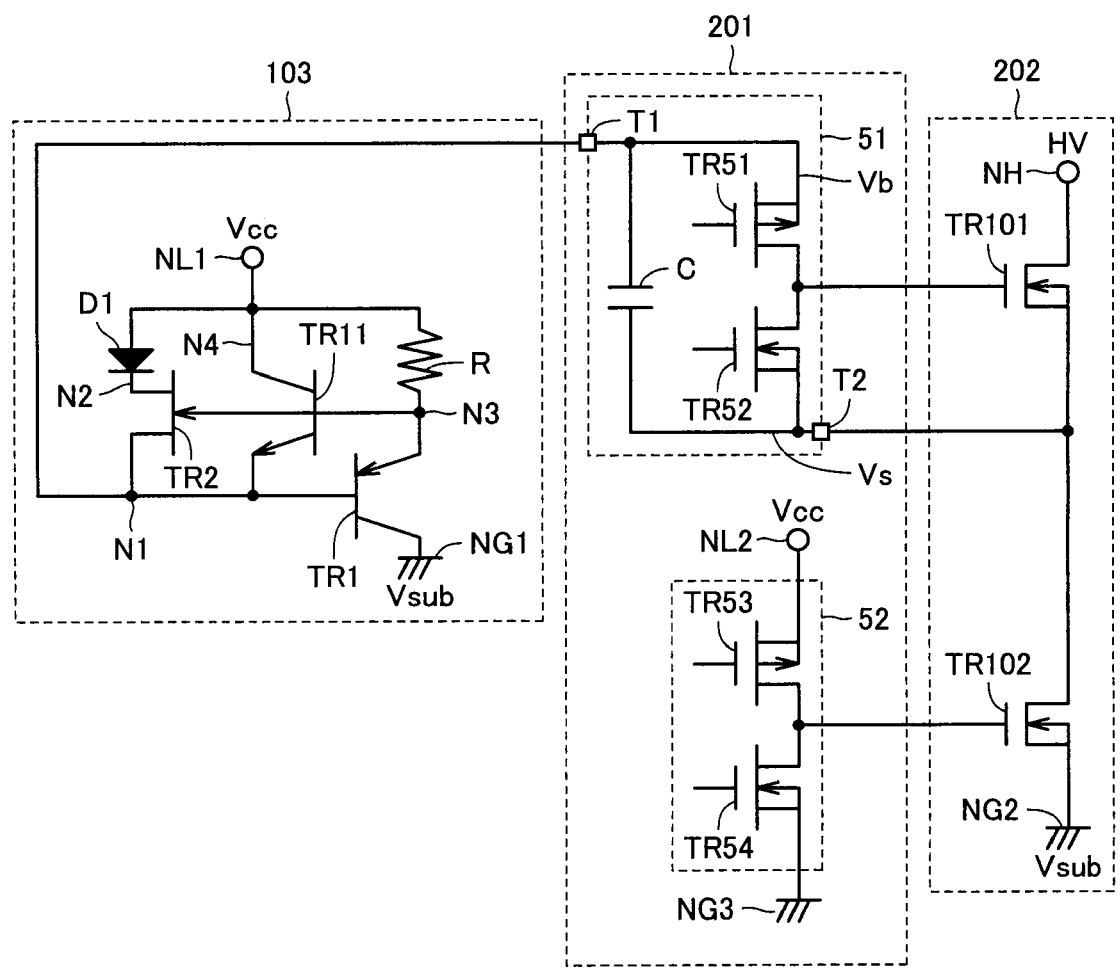
FIG. 4 is a circuit diagram showing a configuration of a semiconductor device according to Embodiment 3 of the present invention.

FIG. 4 is a circuit diagram showing a configuration of the semiconductor device according to Embodiment 3 of the present invention.

Referring to FIG. 4, a semiconductor device 103 is different from semiconductor device 101 according to Embodiment 1 of the present invention in further including an NPN transistor TR11. NPN transistor TR11 has a collector connected to power supply potential node NL1, an emitter connected to the first electrode of capacitor C, and a base connected to the second end of resistor R.

Figure 5:
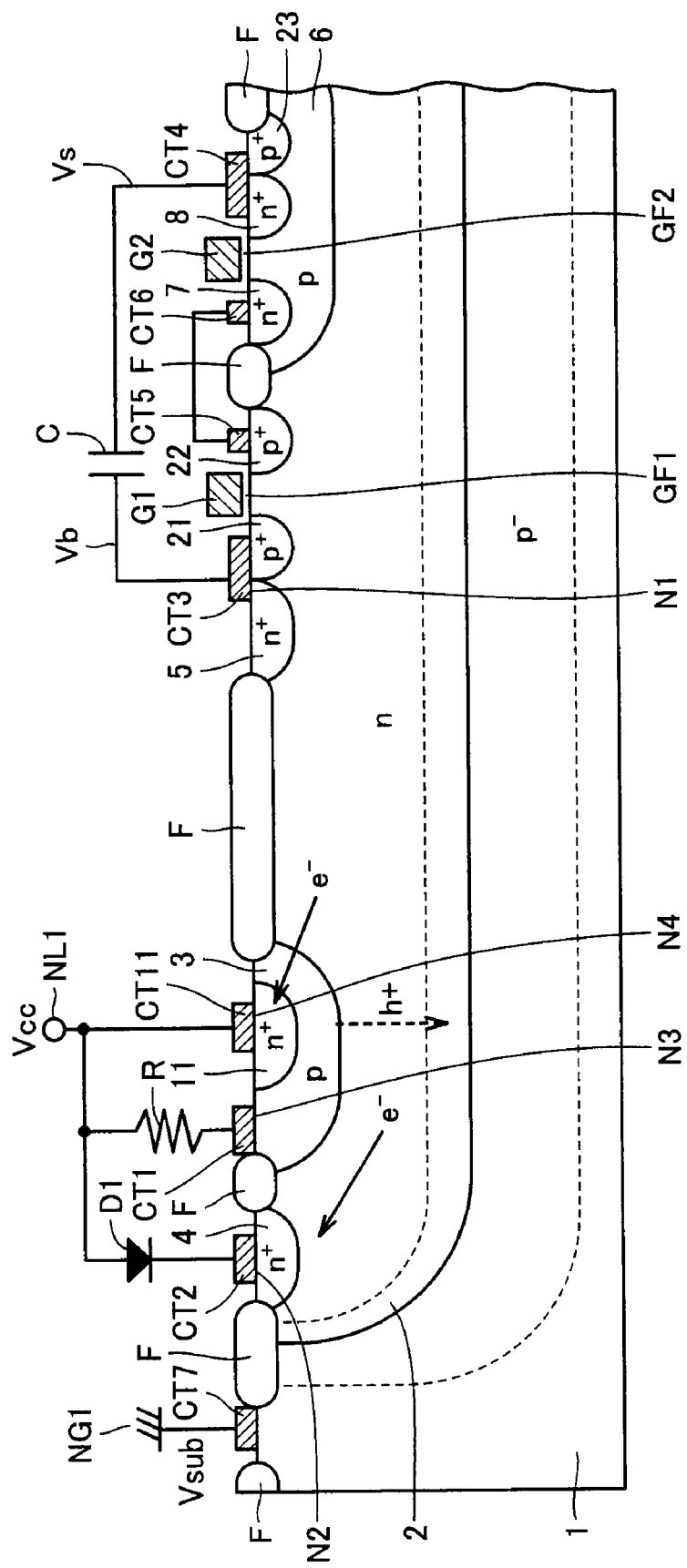
FIG. 5 is a cross-sectional view showing the configuration of the semiconductor device according to Embodiment 3 of the present invention.

FIG. 5 is a cross-sectional view showing the configuration of the semiconductor device according to Embodiment 3 of the present invention.

Referring to FIG. 5, semiconductor device 103 is different from semiconductor device 101 according to Embodiment 1 of the present invention in further including an $n^+$ type diffusion region 11 and a contact CT11.

$N^+$ type diffusion region 11 is formed in the surface of p-type diffusion region 3 at a distance from the main surface of $p^-$ type substrate 1 and n-type diffusion region 2. $N^+$ type diffusion region 11 has a node N4 connected to power supply potential node NL1 through contact CT11.

NPN transistor TR11 has a collector formed of $n^+$ type diffusion region 11, a base formed of p-type diffusion region 3, and an emitter formed of n-type diffusion region 2. NPN transistor TR11 supplies the charging current to capacitor C through n-type diffusion region 2.

According to such a configuration, the charging current supplied to capacitor C is implemented as the sum of the charging current from contact CT1 to capacitor C resulting from holes injected from p-type diffusion region 3 to n-type diffusion region 2, the charging current from contact CT2 to capacitor C supplied by junction field-effect transistor TR2, and the charging current from contact CT11 to capacitor C supplied by NPN transistor TR11.

As the configuration and the operation are otherwise the same as those of the semiconductor device according to Embodiment 1, detailed description will not be repeated here.

Therefore, in the semiconductor device according to Embodiment 3 of the present invention, as compared with semiconductor device 101 according to Embodiment 1 of the present invention, the resistance value of the current path from power supply potential node NL1 to capacitor C can further be lowered, and the charging current can efficiently be supplied to the charging-target element.

The semiconductor device according to Embodiment 3 of the present invention includes $n^+$ type diffusion region 11, however, the semiconductor device may not include $n^+$ type diffusion region 11 as in a semiconductor device according to Embodiment 18 of the present invention which will be described later. Here, p-type diffusion region 3 has node N4 connected to power supply potential node NL1 through contact CT11.

Another embodiment of the present invention will now be described with reference to the drawings. It is noted that the same or corresponding elements in the drawings have the same reference characters allotted, and description thereof will not be repeated.

Embodiment 4

The present embodiment relates to a semiconductor device different from the semiconductor device according to Embodiment 3 in additionally including a protection circuit. The semiconductor device in the present embodiment is the same as the semiconductor device according to Embodiment 3 except for the disclosure below.

Figure 6:
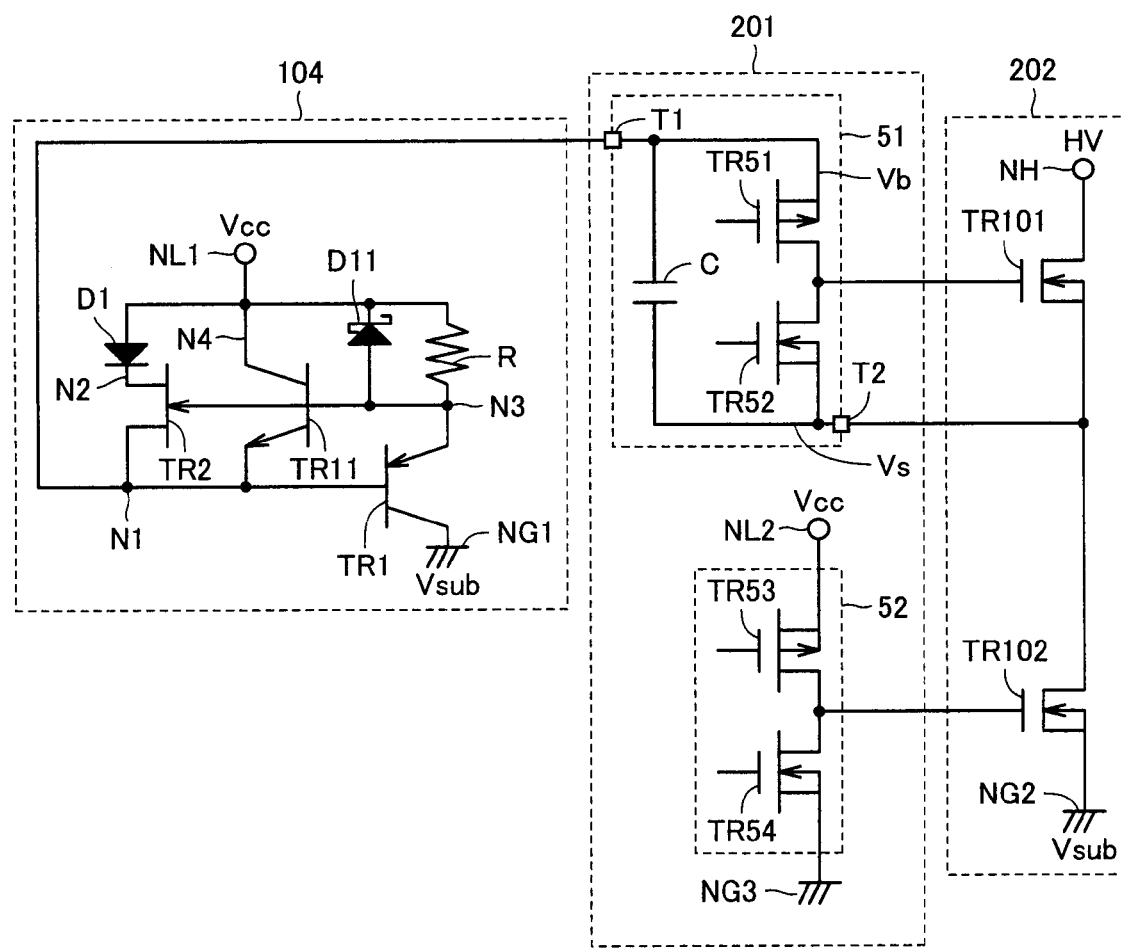
FIG. 6 is a circuit diagram showing a configuration of a semiconductor device according to Embodiment 4 of the present invention.

FIG. 6 is a circuit diagram showing a configuration of the semiconductor device according to Embodiment 4 of the present invention.

Referring to FIG. 6, a semiconductor device 104 is different from semiconductor device 103 according to Embodiment 3 of the present invention in further including a diode D11.

Diode D11 is a Schottky diode, and has an anode connected to p-type diffusion region 3, that is, the second end of resistor R, and a cathode connected to power supply potential node NL1. A forward voltage of diode D11 is smaller than the forward voltage of the pn junction formed by p-type diffusion region 3 and n$^+$ type diffusion region 11.

Here, the drain of high-voltage side power semiconductor element TR101 is connected, for example, to a voltage of several hundred volts. In this case, potential Vs suddenly increases, for example, to several hundred volts in 1 microsecond in response to the switching operation of high-voltage side power semiconductor element TR101 and low-voltage side power semiconductor element TR102.

Accordingly, a displacement current flows through resistor R due to sudden increase in potential Vb and the potential of contact CT1 becomes significantly greater than power supply voltage Vcc. Then, as the forward bias voltage is applied to the pn junction formed by p-type diffusion region 3 and n$^+$ type diffusion region 11, the reverse current may flow from capacitor C to power supply potential node NL1.

The semiconductor device according to Embodiment 4 of the present invention, however, includes diode D11 of which forward voltage is smaller than the forward voltage of the pn junction formed by p-type diffusion region 3 and n$^+$ type diffusion region 11. According to such a configuration, application of the forward bias voltage to the pn junction formed by p-type diffusion region 3 and n$^+$ type diffusion region 11 can be prevented, and therefore, the reverse current can be prevented from flowing from capacitor C to power supply potential node NL1.

As the configuration and the operation are otherwise the same as those of the semiconductor device according to Embodiment 3, detailed description will not be repeated here.

Therefore, in the semiconductor device according to Embodiment 4 of the present invention, the charging current can efficiently be supplied to the charging-target element, as in the semiconductor device according to Embodiment 3 of the present invention.

Another embodiment of the present invention will now be described with reference to the drawings. It is noted that the same or corresponding elements in the drawings have the same reference characters allotted, and description thereof will not be repeated.

Embodiment 5

The present embodiment relates to a semiconductor device different from the semiconductor device according to Embodiment 3 in additionally including a transistor. The semiconductor device in the present embodiment is the same as the semiconductor device according to Embodiment 3 except for the disclosure below.

Figure 7:
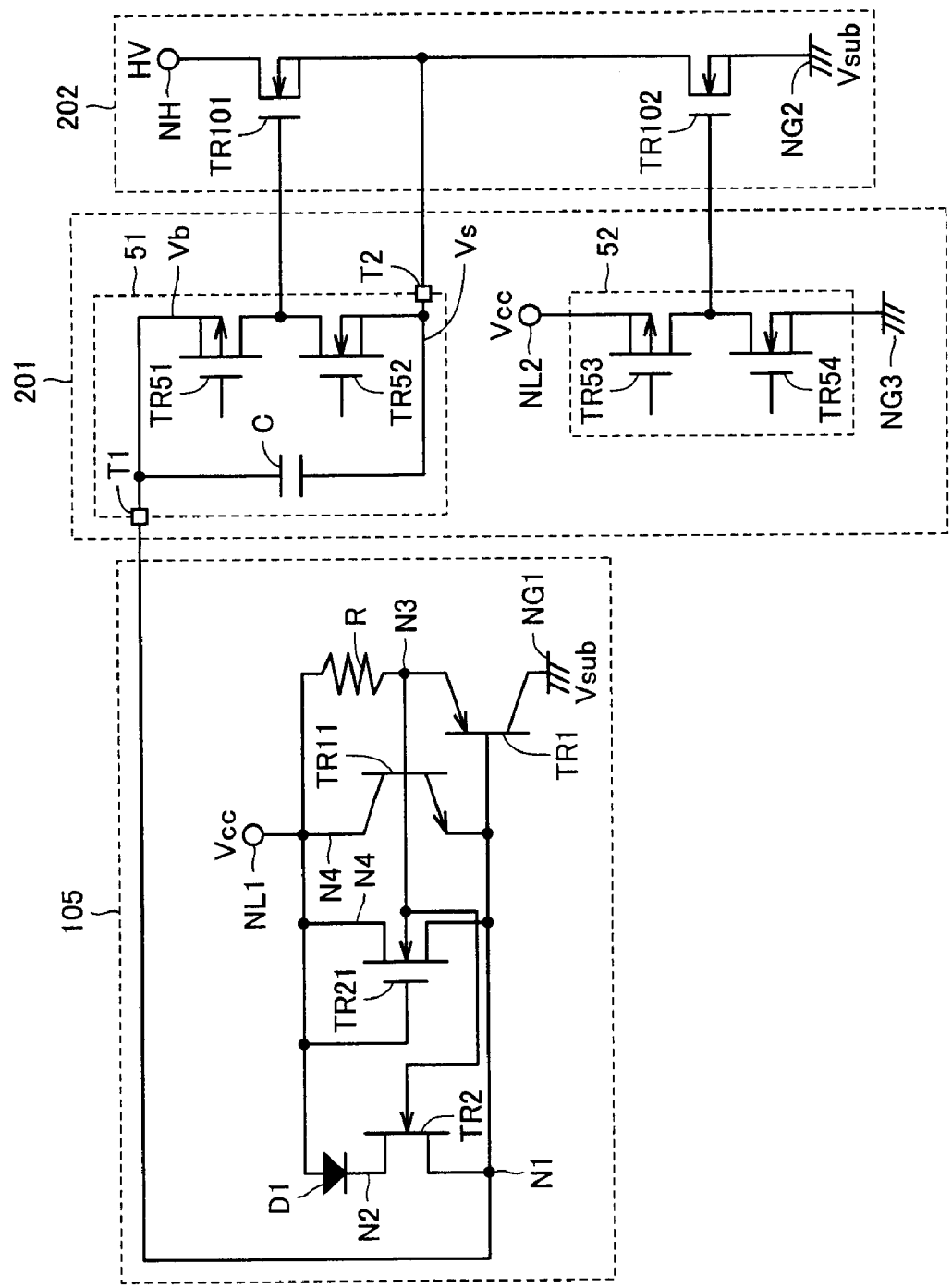
FIG. 7 is a circuit diagram showing a configuration of a semiconductor device according to Embodiment 5 of the present invention.

FIG. 7 is a circuit diagram showing a configuration of the semiconductor device according to Embodiment 5 of the present invention.

Referring to FIG. 7, a semiconductor device 105 is different from semiconductor device 103 according to Embodiment 3 of the present invention in further including an N-channel MOS transistor TR21.

N-channel MOS transistor TR21 has the drain connected to power supply potential node NL1, the source connected to the first electrode of capacitor C, and the gate connected to power supply potential node NL1.

Figure 8:
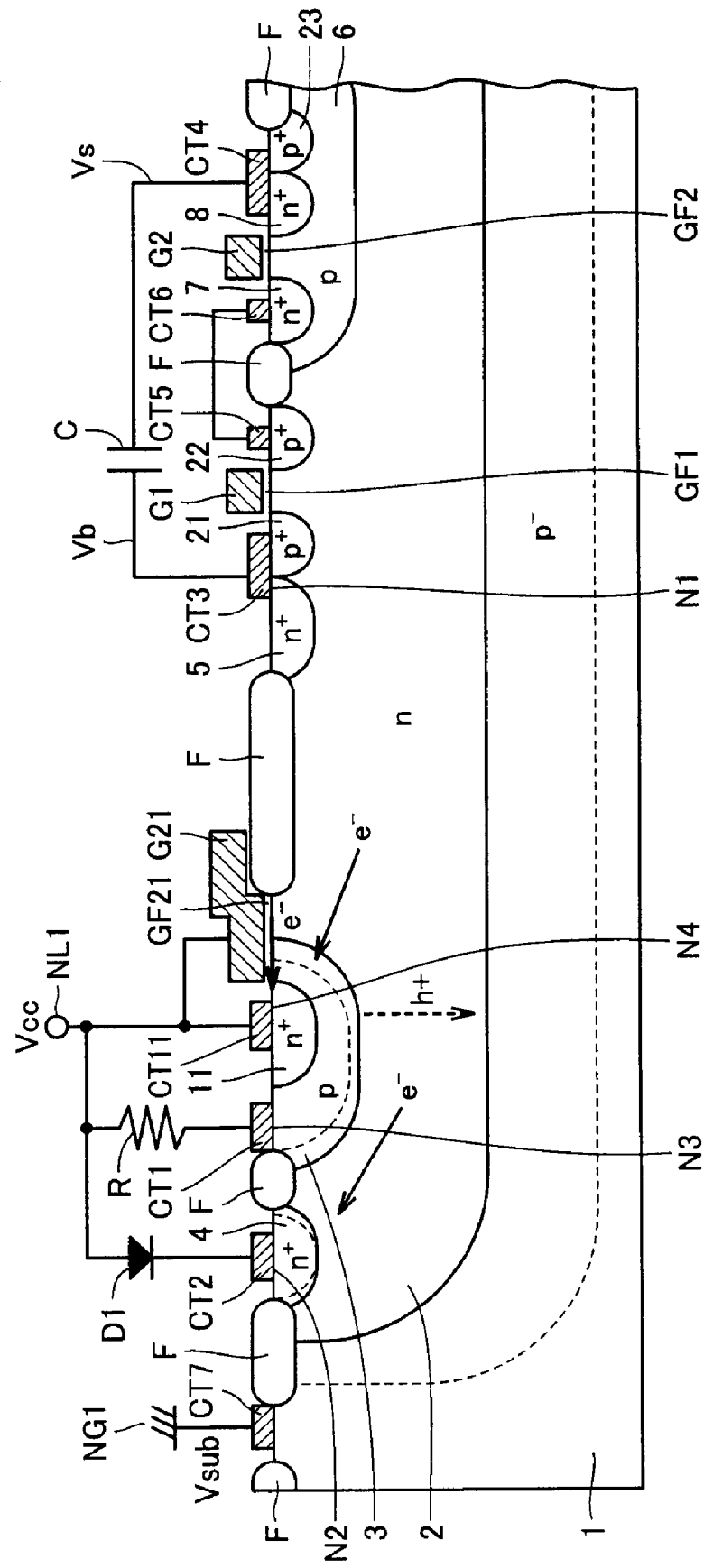
FIG. 8 is a cross-sectional view showing the configuration of the semiconductor device according to Embodiment 5 of the present invention.

FIG. 8 is a cross-sectional view showing the configuration of the semiconductor device according to Embodiment 5 of the present invention.

Referring to FIG. 8, semiconductor device 105 is different from semiconductor device 103 according to Embodiment 3 of the present invention in further including a gate electrode G21 and a gate insulating film GF21.

N-channel MOS transistor TR21 has gate electrode G21 formed on the surface of p-type diffusion region 3 with gate insulating film GF21 being interposed, the source formed of n-type diffusion region 2, and the drain formed of n$^+$ type diffusion region 11. Gate electrode G21 is provided, opposed to a channel region in p-type diffusion region 3 lying between n-type diffusion region 2 and n$^+$ type diffusion region 11, with gate insulating film GF21 being interposed. N-channel MOS transistor TR21 supplies the charging current to capacitor C through n-type diffusion region 2.

When potential Vb lowers and becomes lower than power supply voltage Vcc, a positive bias voltage is applied to gate electrode G21 by an amount of voltage lowering due to the current that flows through resistor R. When the positive bias voltage exceeds a threshold voltage of N-channel MOS transistor TR21, N-channel MOS transistor TR21 turns on, and N-channel MOS transistor TR21 supplies the charging current to capacitor C through n-type diffusion region 2.

According to such a configuration, the charging current supplied to capacitor C is implemented as the sum of the charging current from contact CT1 to capacitor C resulting from holes injected from p-type diffusion region 3 to n-type diffusion region 2, the charging current from contact CT2 to capacitor C supplied by junction field-effect transistor TR2, the charging current from contact CT11 to capacitor C supplied by NPN transistor TR11, and the charging current from contact CT11 to capacitor C supplied by N-channel MOS transistor TR21.

As the configuration and the operation are otherwise the same as those of the semiconductor device according to Embodiment 3, detailed description will not be repeated here.

Therefore, in the semiconductor device according to Embodiment 5 of the present invention, as compared with semiconductor device 103 according to Embodiment 3 of the present invention, the resistance value of the current path from power supply potential node NL1 to capacitor C can further be lowered, and the charging current can efficiently be supplied to the charging-target element.

Another embodiment of the present invention will now be described with reference to the drawings. It is noted that the same or corresponding elements in the drawings have the same reference characters allotted, and description thereof will not be repeated.

Embodiment 6

The present embodiment relates to a semiconductor device different from the semiconductor device according to Embodiment 5 in additionally including a protection circuit. The semiconductor device in the present embodiment is the same as the semiconductor device according to Embodiment 5 except for the disclosure below.

Figure 9:
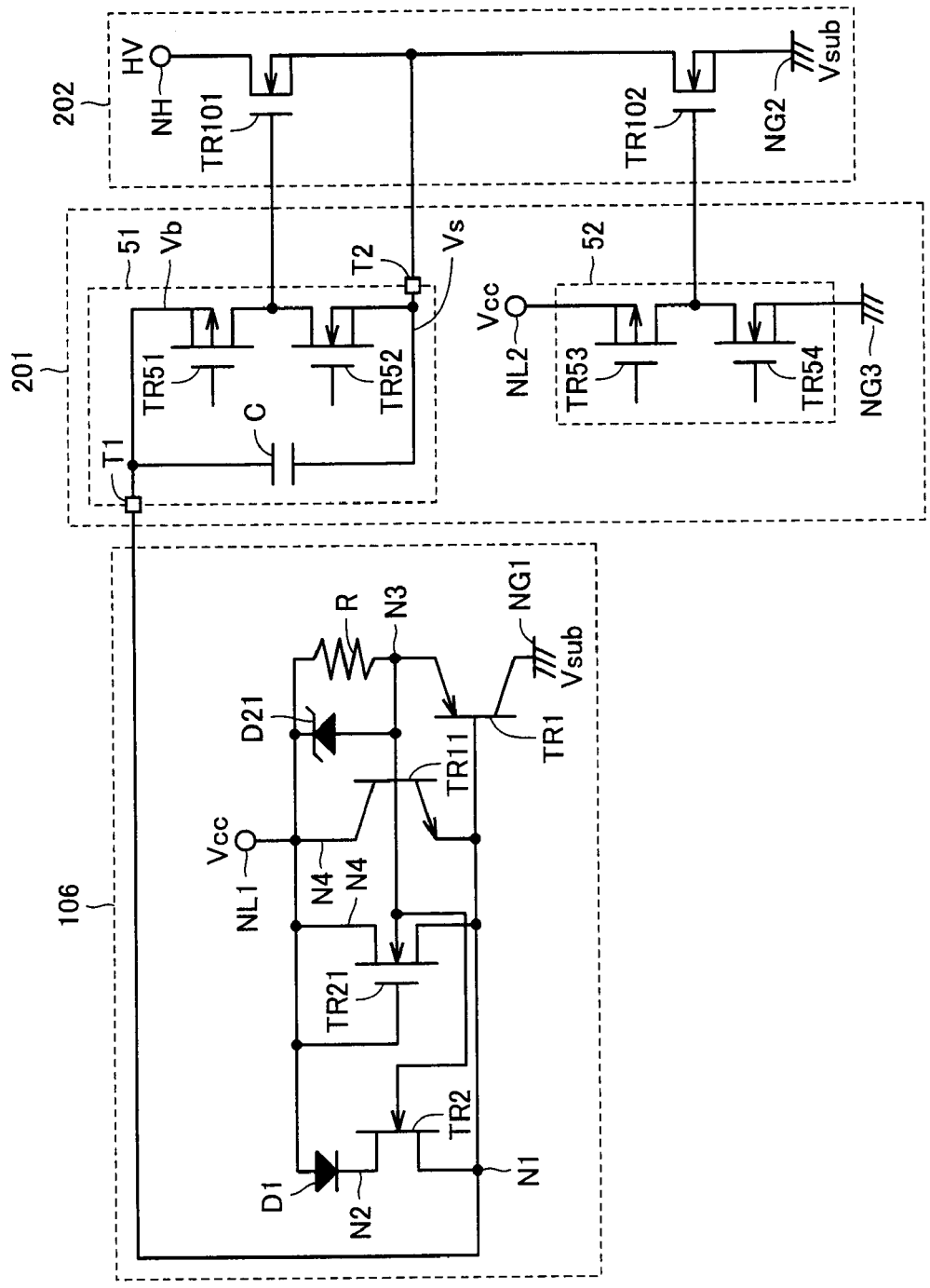
FIG. 9 is a circuit diagram showing a configuration of a semiconductor device according to Embodiment 6 of the present invention.

FIG. 9 is a circuit diagram showing a configuration of the semiconductor device according to Embodiment 6 of the present invention.

Referring to FIG. 9, a semiconductor device 106 is different from semiconductor device 105 according to Embodiment 5 of the present invention in further including a diode D21.

Diode D21 is a Zener diode, and has an anode connected to p-type diffusion region 3, that is, the second end of resistor R, and a cathode connected to power supply potential node NL1. Diode D21 clamps an applied reverse voltage to a prescribed voltage value.

According to such a configuration, application of a transient overvoltage to gate electrode G21 of N-channel MOS transistor TR21 can be prevented, and gate breakdown of N-channel MOS transistor TR21 can be prevented.

As the configuration and the operation are otherwise the same as those of the semiconductor device according to Embodiment 5, detailed description will not be repeated here.

Therefore, in the semiconductor device according to Embodiment 6 of the present invention, the charging current can efficiently be supplied to the charging-target element, as in the semiconductor device according to Embodiment 5 of the present invention.

Another embodiment of the present invention will now be described with reference to the drawings. It is noted that the same or corresponding elements in the drawings have the same reference characters allotted, and description thereof will not be repeated.

Embodiment 7

The present embodiment relates to a semiconductor device different from the semiconductor device according to Embodiment 5 in additionally including a protection circuit. The semiconductor device in the present embodiment is the same as the semiconductor device according to Embodiment 5 except for the disclosure below.

Figure 10:
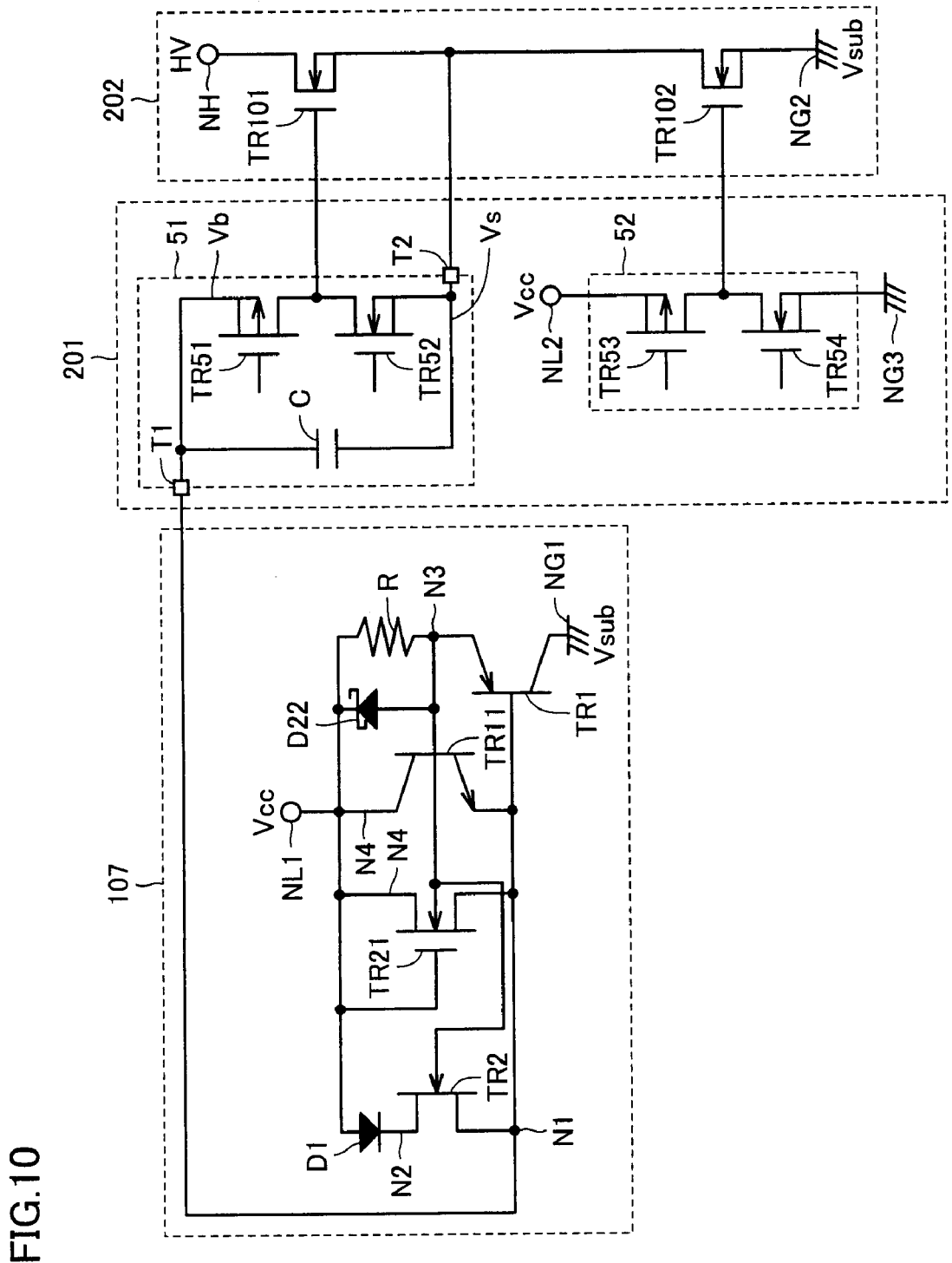
FIG. 10 is a circuit diagram showing a configuration of a semiconductor device according to Embodiment 7 of the present invention.

FIG. 10 is a circuit diagram showing a configuration of the semiconductor device according to Embodiment 7 of the present invention.

Referring to FIG. 10, a semiconductor device 107 is different from semiconductor device 105 according to Embodiment 5 of the present invention in further including a diode D22.

Diode D22 is a Schottky diode, and has an anode connected to p-type diffusion region 3, that is, the second end of resistor R, and a cathode connected to power supply potential node NL1. A forward voltage of diode D22 is smaller than the forward voltage of the pn junction formed by p-type diffusion region 3 and $n^+$ type diffusion region 11.

Here, the drain of high-voltage side power semiconductor element TR101 is connected, for example, to a voltage of several hundred volts. In this case, potential Vs suddenly increases, for example, to several hundred volts in 1 microsecond in response to the switching operation of high-voltage side power semiconductor element TR101 and low-voltage side power semiconductor element TR102.

Accordingly, a displacement current flows through resistor R due to sudden increase in potential Vb and the potential of contact CT1 becomes significantly greater than power supply voltage Vcc. Then, as the forward bias voltage is applied to the pn junction formed by p-type diffusion region 3 and $n^+$ type diffusion region 11, the reverse current may flow from capacitor C to power supply potential node NL1.

The semiconductor device according to Embodiment 7 of the present invention, however, includes diode D22 of which forward voltage is smaller than the forward voltage of the pn junction formed by p-type diffusion region 3 and $n^+$ type diffusion region 11. According to such a configuration, application of the forward bias voltage to the pn junction formed by p-type diffusion region 3 and $n^+$ type diffusion region 11 can be prevented, and therefore, the reverse current can be prevented from flowing from capacitor C to power supply potential node NL1.

As the configuration and the operation are otherwise the same as those of the semiconductor device according to Embodiment 5, detailed description will not be repeated here.

Therefore, in the semiconductor device according to Embodiment 7 of the present invention, the charging current can efficiently be supplied to the charging-target element, as in the semiconductor device according to Embodiment 5 of the present invention.

Another embodiment of the present invention will now be described with reference to the drawings. It is noted that the same or corresponding elements in the drawings have the same reference characters allotted, and description thereof will not be repeated.

Embodiment 8

The present embodiment relates to a semiconductor device different from the semiconductor device according to Embodiment 1 in including a bipolar transistor instead of the junction field-effect transistor. The semiconductor device in the present embodiment is the same as the semiconductor device according to Embodiment 1 except for the disclosure below.

[Configuration and Basic Operation]

Figure 11:
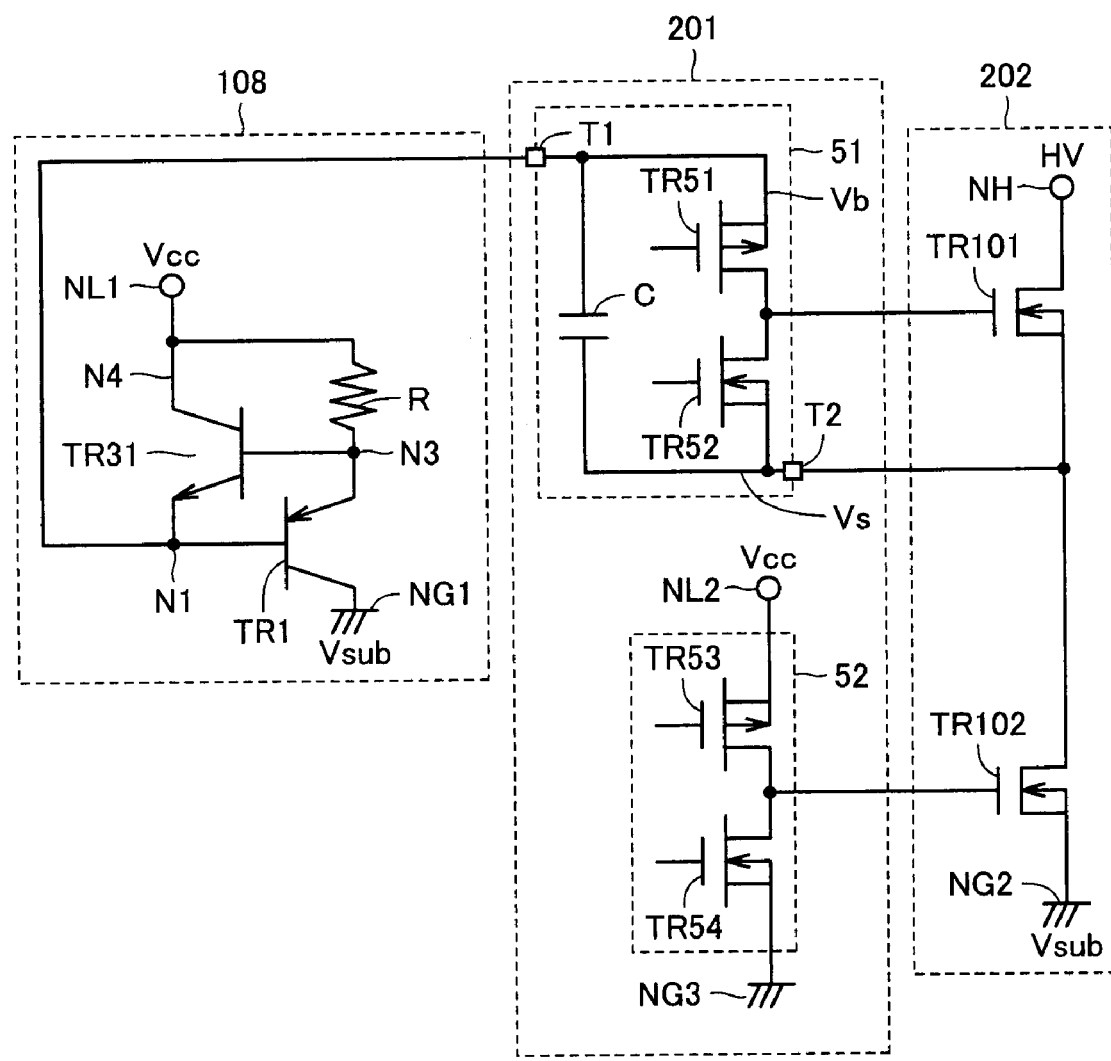
FIG. 11 is a circuit diagram showing a configuration of a semiconductor device according to Embodiment 8 of the present invention.

FIG. 11 is a circuit diagram showing a configuration of the semiconductor device according to Embodiment 8 of the present invention.

Referring to FIG. 11, a semiconductor device 108 includes PNP transistor TR1, an NPN transistor TR31, and resistor (charge carrier drift restriction portion) R.

Resistor R has the first end connected to power supply potential node NL1. PNP transistor TR1 has the emitter (conducting electrode) connected to the second end of resistor R, the collector (conducting electrode) connected to ground potential node NG1, and the base (control electrode) connected to the first electrode of capacitor C. NPN transistor TR31 has a collector connected to power supply potential node NL1, an emitter connected to the first electrode of capacitor C, and a base connected to the second end of resistor R.

Figure 12:
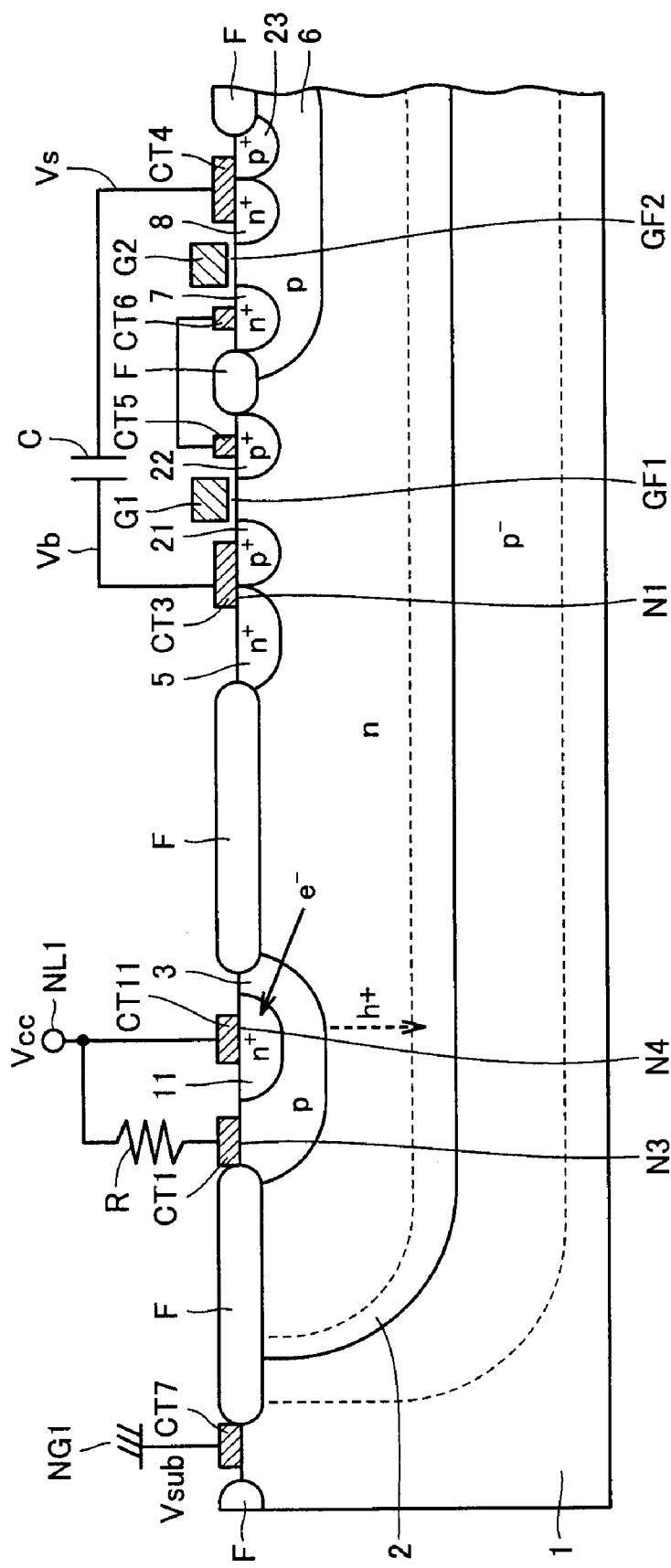
FIG. 12 is a cross-sectional view showing the configuration of the semiconductor device according to Embodiment 8 of the present invention.

FIG. 12 is a cross-sectional view showing the configuration of the semiconductor device according to Embodiment 8 of the present invention.

Referring to FIG. 12, semiconductor device 108 includes $p^-$ type substrate (semiconductor layer) 1, n-type diffusion region (first semiconductor region) 2, p-type diffusion region (second semiconductor region) 3, $n^+$ type diffusion region 5, p-type diffusion region 6, $n^+$ type diffusion regions 7 and 8, resistor R, contacts CT1, CT3 to CT7, and CT11, $n^+$ type diffusion region (charge carrier drift restriction portion) 11, $p^+$ type diffusion regions 21 to 23, gate electrodes G1 and G2, gate insulating films GF1 and GF2, and oxide film F.

A dotted line in FIG. 12 indicates a boundary of a depletion layer extending from the junction surface between $p^-$ type substrate 1 and n-type diffusion region 2.

P⁻ type substrate 1 is connected to ground potential node NG1 through contact CT7. N-type diffusion region 2 is formed on the main surface of p⁻ type substrate 1.

P-type diffusion region 3 is formed in the surface of n-type diffusion region 2 at a distance from the main surface of p⁻ type substrate 1. P-type diffusion region 3 has node N3 coupled to power supply potential node NL1.

N⁺ type diffusion region 11 is formed in the surface of p-type diffusion region 3 at a distance from the main surface of p⁻ type substrate 1 and n-type diffusion region 2. N⁺ type diffusion region 11 has node N4 coupled to power supply potential node NL1 through contact CT11. N⁺ type diffusion region 11 restricts drift of holes (charge carrier) from node N4 to p⁻ type substrate 1.

N⁺ type diffusion region 5 is formed in the surface of n-type diffusion region 2 at a distance from the main surface of p⁻ type substrate 1 and p-type diffusion region 3. N⁺ type diffusion region 5 has node N1 coupled to the first electrode of capacitor C. Namely, n⁺ type diffusion region 5 is connected to the first electrode of capacitor C through contact CT3.

Here, semiconductor device 108 may not include n⁺ type diffusion region 5. In this case, n-type diffusion region 2 has node N1 coupled to the first electrode of capacitor C.

Resistor R has the first end connected to power supply potential node NL1 and the second end connected to p-type diffusion region 3 through CT1. Resistor R restricts drift of holes (charge carrier) from node N3 to p⁻ type substrate 1.

PNP transistor TR1 has the collector formed of p⁻ type substrate 1, the base formed of n-type diffusion region 2, and the emitter formed of p-type diffusion region 3. PNP transistor TR1 supplies the charging current to capacitor C through n-type diffusion region 2.

NPN transistor TR31 has the collector formed of n⁺ type diffusion region 11, the base formed of p-type diffusion region 3, and the emitter formed of n-type diffusion region 2. NPN transistor TR31 supplies the charging current to capacitor C through n-type diffusion region 2.

P⁺ type diffusion region 21 is formed in the surface of n-type diffusion region 2 at a distance from the main surface of p⁻ type substrate 1 and p-type diffusion region 3. P⁺ type diffusion region 21 is connected to the first electrode of capacitor C through contact CT3.

P⁺ type diffusion region 22 is formed in the surface of n-type diffusion region 2 at a distance from the main surface of p⁻ type substrate 1, p-type diffusion region 3, and p⁺ type diffusion region 21. P⁺ type diffusion region 22 is connected to n⁺ type diffusion region 7 through contacts CT5 and CT6.

P-channel MOS transistor TR51 has gate electrode G1 formed on the surface of n-type diffusion region 2 with gate insulating film GF1 being interposed, the source formed of p⁺ type diffusion region 21, and the drain formed of p⁺ type diffusion region 22. Gate electrode G1 is provided, opposed to the channel region in n-type diffusion region 2 lying between p⁺ type diffusion regions 21 and 22, with gate insulating film GF1 being interposed.

P-type diffusion region 6 is formed in the surface of n-type diffusion region 2 at a distance from the main surface of p⁻ type substrate 1, p-type diffusion region 3, n⁺ type diffusion region 5, p⁺ type diffusion region 21, and p⁺ type diffusion region 22.

N⁺ type diffusion region 7 is formed in the surface of p-type diffusion region 6 at a distance from the main surface of p⁻ type substrate 1 and n-type diffusion region 2. N⁺ type diffusion region 7 is connected to p⁺ type diffusion region 22 through contacts CT5 and CT6.

N⁺ type diffusion region 8 is formed in the surface of p-type diffusion region 6 at a distance from the main surface of p⁻ type substrate 1, n-type diffusion region 2, and n⁺ type diffusion region 7. N⁺ type diffusion region 8 is connected to the second electrode of capacitor C through contact CT4.

N-channel MOS transistor TR52 has gate electrode G2 formed on the surface of p-type diffusion region 6 with gate insulating film GF2 being interposed, the drain formed of n⁺ type diffusion region 7, and the source formed of n⁺ type diffusion region 8. Gate electrode G2 is provided, opposed to the channel region in p-type diffusion region 6 lying between n⁺ type diffusion regions 7 and 8, with gate insulating film GF2 being interposed.

P⁺ type diffusion region 23 is formed in the surface of p-type diffusion region 6 at a distance from the main surface of p⁻ type substrate 1 and n⁺ type diffusion region 7. P⁺ type diffusion region 23 is connected to the second electrode of capacitor C through contact CT4.

P-type diffusion regions 3 and 6 have an impurity concentration higher than p⁻ type substrate 1. P⁺ type diffusion regions 21 to 23 have an impurity concentration higher than p-type diffusion regions 3 and 6. N⁺ type diffusion regions 5, 7, 8, and 11 have an impurity concentration higher than n-type diffusion region 2.

Semiconductor device 108 is designed to adapt to a power conversion circuit in which a withstand voltage, for example, of 600V is required. Here, the impurity concentration of p⁻ type substrate 1 is set in a range from $5 \times 10^{13}/cm^3$ to $5 \times 10^{14}/cm^3$, and power supply voltage Vcc is set, for example, in a range from 15V to 30V.

[Operation]

An operation of the semiconductor device according to Embodiment 8 of the present invention when it charges capacitor C will now be described.

Power supply voltage Vcc is set, for example, to 15V, and high voltage HV is set, for example, to 300V. Potential Vs of reference voltage terminal T2 of high-voltage side drive circuit 51 varies, for example, in a range from 0V to 300V.

In addition, potential Vb of power supply voltage terminal T1 of high-voltage side drive circuit 51 is higher than potential Vs by a voltage held by capacitor C.

Here, potential Vs repeatedly rises and lowers in response to the switching operation of high-voltage side power semiconductor element TR101 and low-voltage side power semiconductor element TR102. Accordingly, potential Vb also repeatedly rises and lowers in correspondence with potential Vs. In other words, potential Vb alternately repeats a state of Vb<Vcc and a state of Vb>Vcc.

Here, if potential Vb lowers and becomes lower than power supply voltage Vcc, PNP transistor TR1 turns on. Namely, a forward bias voltage is applied to the pn junction formed by p-type diffusion region 3 and n-type diffusion region 2. Then, holes are injected from p-type diffusion region 3 to n-type diffusion region 2. Namely, a current is supplied from power supply potential node NL1 to capacitor C through resistor R, p-type diffusion region 3, n-type diffusion region 2, and n⁺ type diffusion region 5, thus charging capacitor C.

In addition, when potential Vb lowers and becomes lower than power supply voltage Vcc, NPN transistor TR31 supplies a current to capacitor C. Namely, the current is supplied from power supply potential node NL1 to capacitor C through n⁺ type diffusion region 11, p-type diffusion region 3, n-type diffusion region 2, and n⁺ type diffusion region 5, thus charging capacitor C.

On the other hand, if potential Vb rises and exceeds power supply voltage Vcc, a reverse bias voltage is applied to the pn junction formed by p-type diffusion region 3 and n-type diffusion region 2. Accordingly, a reverse current from capacitor C to power supply potential node NL1 through n⁺ type diffusion region 5, n-type diffusion region 2, p-type diffusion region 3, and resistor R is blocked. Similarly, the reverse current from capacitor C to power supply potential node NL1 through n+ type diffusion region 5, n-type diffusion region 2, p-type diffusion region 3, and n+ type diffusion region 11 is also blocked.

Thus, each time potential Vb attains to power supply voltage Vcc or lower, capacitor C is charged. Therefore, capacitor C can serve as the power supply for high-voltage side drive circuit 51 serving as the floating circuit. In addition, the reverse current from capacitor C to power supply potential node NL1 can be blocked.

Here, in PNP transistor TR1 formed of p− type substrate 1, n-type diffusion region 2 and p-type diffusion region 3, the current from p-type diffusion region 3 to p− type substrate 1, which is the collector current, is greater than the current from p-type diffusion region 3 to capacitor C, which is the base current, by hFE (current amplification factor) of PNP transistor TR1. Namely, in charging capacitor C, most of holes injected from p-type diffusion region 3 to n-type diffusion region 2 flow toward p− type substrate 1. Accordingly, assuming that semiconductor device 108 does not include resistor R, even if a large amount of current flows from power supply potential node NL1 to contact CT1 during charging capacitor C, only a small amount of current reaches capacitor C. Therefore, power loss of the power supply supplying power supply voltage Vcc is considerably large.

The semiconductor device according to Embodiment 8 of the present invention, however, includes resistor R connected between power supply potential node NL1 and p-type diffusion region 3. According to such a configuration, the potential of contact CT1 is smaller than power supply voltage Vcc by an amount of voltage lowering in resistor R. Therefore, in the semiconductor device according to Embodiment 8 of the present invention, an amount of holes injected from p-type diffusion region 3 to n-type diffusion region 2 can be restricted and power loss of the power supply can be reduced.

Meanwhile, with such a configuration as simply including resistor R connected between power supply potential node NL1 and p-type diffusion region 3, an amount of holes that flow from power supply potential node NL1 into n-type diffusion region 2 through p-type diffusion region 3 is reduced by resistor R, and therefore, the charging current from power supply potential node NL1 to capacitor C becomes smaller.

The semiconductor device according to Embodiment 8 of the present invention, however, includes n+ type diffusion region 11 formed in the surface of p-type diffusion region 3 at a distance from the main surface of p− type substrate 1 and n-type diffusion region 2 and coupled to power supply potential node NL1. According to such a configuration, as the charging current can be supplied from NPN transistor TR31 formed of n+ type diffusion region 11, p-type diffusion region 3 and n-type diffusion region 2 to capacitor C through n-type diffusion region 2, the charging current from power supply potential node NL1 to capacitor C can be prevented from becoming smaller.

In the configuration including the junction field-effect transistor supplying the charging current to capacitor C as in the configuration described in Non-Patent Document 1, if potential Vb lowers and becomes lower than power supply voltage Vcc, the depletion layer extends from p-type diffusion region 3 in n-type diffusion region 2. Accordingly, a resistance of n-type diffusion region 2 increases, and the charging current to capacitor C becomes smaller.

Unlike semiconductor device 1001 according to Embodiment 1 of the present invention, however, the semiconductor device according to Embodiment 8 of the present invention does not include n+ type diffusion region 4 coupled to power supply potential node NL1, and therefore, the junction field-effect transistor is not formed. Namely, as the depletion layer can be prevented from extending from p-type diffusion region 3 in n-type diffusion region 2, the resistance of n-type diffusion region 2 can be lowered, and the charging current from power supply potential node NL1 to capacitor C can be prevented from becoming smaller.

In addition, in the semiconductor device according to Embodiment 8 of the present invention, p-type diffusion region 3 is coupled to power supply potential node NL1. According to such a configuration, when potential Vb lowers and becomes lower than power supply voltage Vcc, the forward bias voltage is applied to the pn junction formed by p-type diffusion region 3 and n-type diffusion region 2, and therefore, the depletion layer can be prevented from extending from p-type diffusion region 3 in n-type diffusion region 2.

In addition, in the semiconductor device according to Embodiment 8 of the present invention, when potential Vb lowers and becomes lower than power supply voltage Vcc, the forward bias voltage is applied to the pn junction formed by p-type diffusion region 3 and n-type diffusion region 2, and therefore, holes are injected from p-type diffusion region 3 to n-type diffusion region 2. These injected holes cause conductivity modulation in n-type diffusion region 2. Namely, concentrated electrons in n-type diffusion region 2 cause higher conductivity of n-type diffusion region 2. Therefore, in the semiconductor device according to Embodiment 8 of the present invention, increase in the resistance of n-type diffusion region 2 can be prevented, and the charging current to capacitor C can be prevented from becoming smaller.

In the semiconductor device according to Embodiment 8 of the present invention, by adjusting a resistance value of resistor R, an amount of holes injected from p-type diffusion region 3 to n-type diffusion region 2 can appropriately be set.

As described above, in the semiconductor device according to Embodiment 8 of the present invention, the charging current can efficiently be supplied to the charging-target element.

Another embodiment of the present invention will now be described with reference to the drawings. It is noted that the same or corresponding elements in the drawings have the same reference characters allotted, and description thereof will not be repeated.

Embodiment 9

The present embodiment relates to a semiconductor device different from the semiconductor device according to Embodiment 8 in additionally including a protection circuit. The semiconductor device in the present embodiment is the same as the semiconductor device according to Embodiment 8 except for the disclosure below.

Figure 13:
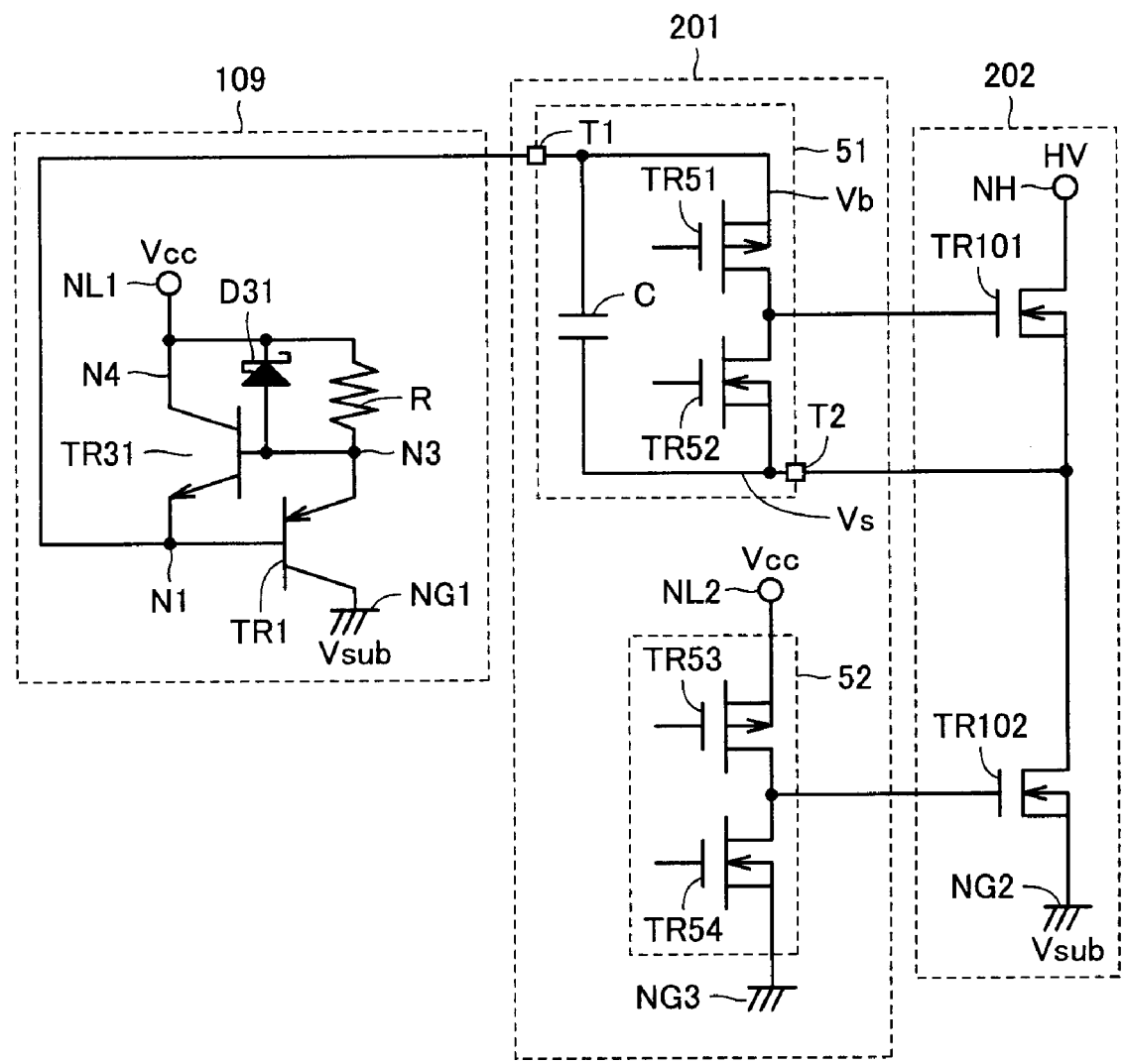
FIG. 13 is a circuit diagram showing a configuration of a semiconductor device according to Embodiment 9 of the present invention.

FIG. 13 is a circuit diagram showing a configuration of the semiconductor device according to Embodiment 9 of the present invention.

Referring to FIG. 13, a semiconductor device 109 is different from semiconductor device 108 according to Embodiment 8 of the present invention in further including a diode D31.

Diode D31 is a Schottky diode, and has an anode connected to p-type diffusion region 3, that is, the second end of resistor R, and a cathode connected to power supply potential node NL1. A forward voltage of diode D31 is smaller than the forward voltage of the pn junction formed by p-type diffusion region 3 and n+ type diffusion region 11.

Here, the drain of high-voltage side power semiconductor element TR101 is connected, for example, to a voltage of several hundred volts. In this case, potential Vs suddenly increases, for example, to several hundred volts in 1 microsecond in response to the switching operation of high-voltage side power semiconductor element TR101 and low-voltage side power semiconductor element TR102.

Accordingly, a displacement current flows through resistor R due to sudden increase in potential Vb and the potential of contact CT1 becomes significantly greater than power supply voltage Vcc. Then, as the forward bias voltage is applied to the pn junction formed by p-type diffusion region 3 and $n^+$ type diffusion region 11, the reverse current may flow from capacitor C to power supply potential node NL1.

The semiconductor device according to Embodiment 9 of the present invention, however, includes diode D31 of which forward voltage is smaller than the forward voltage of the pn junction formed by p-type diffusion region 3 and $n^+$ type diffusion region 11. According to such a configuration, application of the forward bias voltage to the pn junction formed by p-type diffusion region 3 and $n^+$ type diffusion region 11 can be prevented, and therefore, the reverse current can be prevented from flowing from capacitor C to power supply potential node NL1.

As the configuration and the operation are otherwise the same as those of the semiconductor device according to Embodiment 8, detailed description will not be repeated here.

Therefore, in the semiconductor device according to Embodiment 9 of the present invention, the charging current can efficiently be supplied to the charging-target element, as in the semiconductor device according to Embodiment 8 of the present invention.

Another embodiment of the present invention will now be described with reference to the drawings. It is noted that the same or corresponding elements in the drawings have the same reference characters allotted, and description thereof will not be repeated.

Embodiment 10

The present embodiment relates to a semiconductor device different from the semiconductor device according to Embodiment 8 in additionally including a transistor. The semiconductor device in the present embodiment is the same as the semiconductor device according to Embodiment 8 except for the disclosure below.

Figure 14:
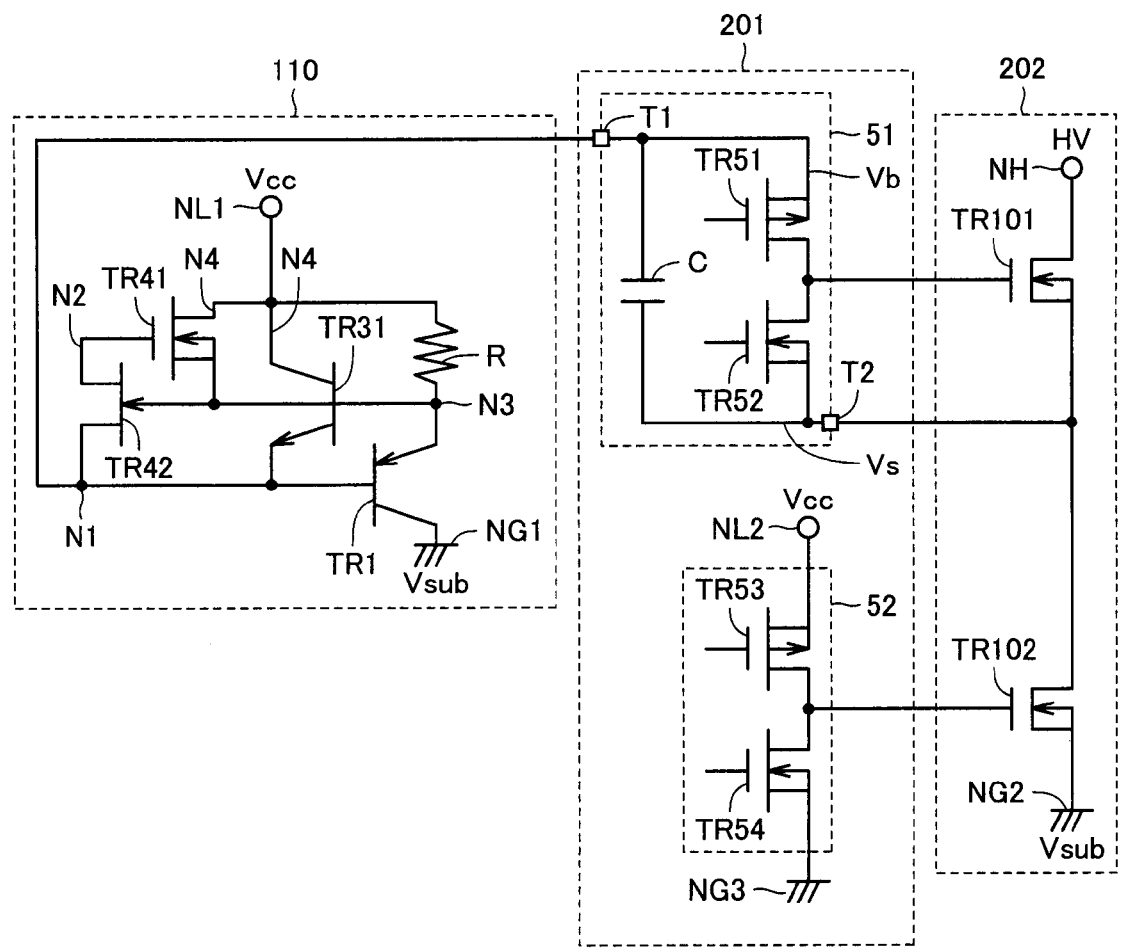
FIG. 14 is a circuit diagram showing a configuration of a semiconductor device according to Embodiment 10 of the present invention.

FIG. 14 is a circuit diagram showing a configuration of the semiconductor device according to Embodiment 10 of the present invention.

Referring to FIG. 14, a semiconductor device 110 is different from semiconductor device 108 according to Embodiment 8 of the present invention in further including an N-channel MOS transistor TR41 and a junction field-effect transistor TR42.

N-channel MOS transistor TR41 has the drain connected to power supply potential node NL1 and the source connected to the second end of resistor R.

Junction field-effect transistor TR42 has the drain connected to the gate of N-channel MOS transistor TR41, the gate connected to the second end of resistor R, and the source connected to the first electrode of capacitor C.

Figure 15:
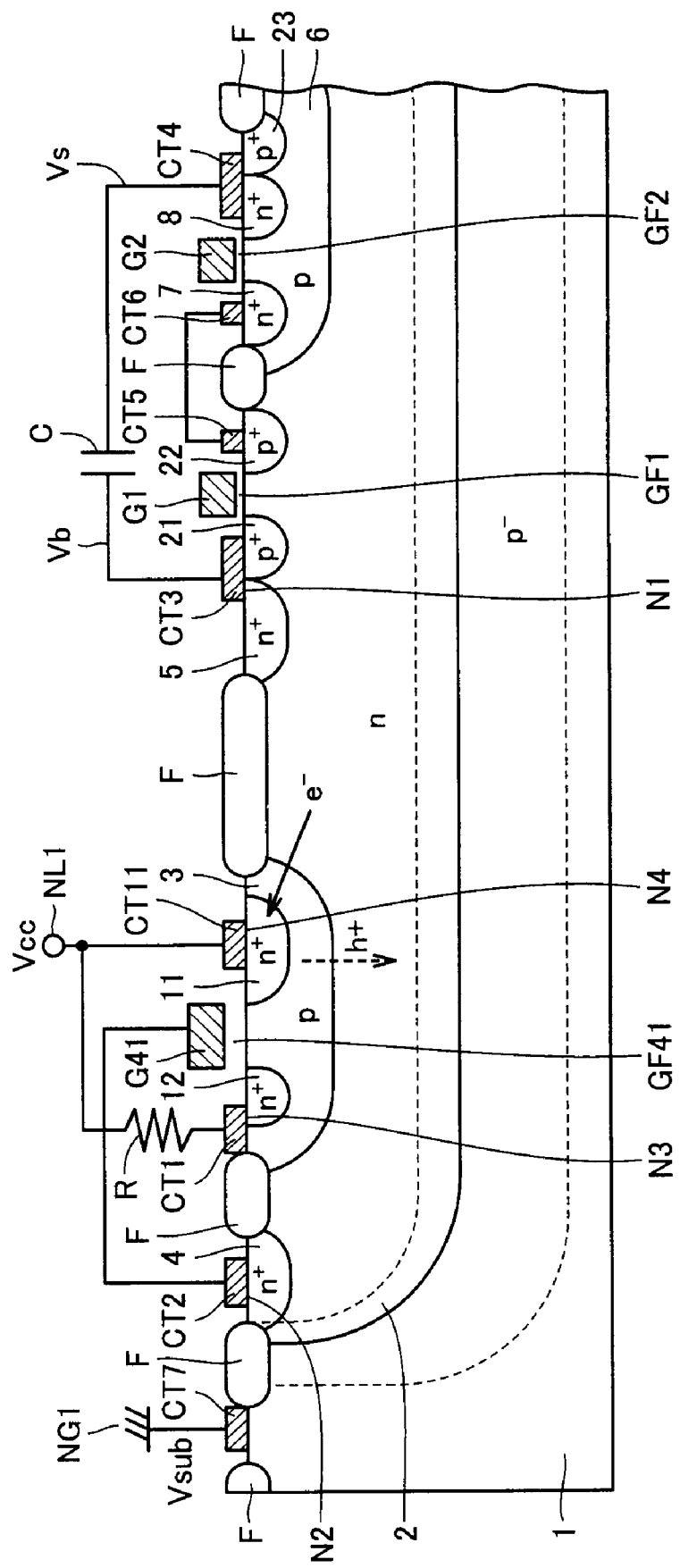
FIG. 15 is a cross-sectional view showing the configuration of the semiconductor device according to Embodiment 10 of the present invention.

FIG. 15 is a cross-sectional view showing the configuration of the semiconductor device according to Embodiment 10 of the present invention.

Referring to FIG. 15, semiconductor device 110 is different from semiconductor device 108 according to Embodiment 8 of the present invention in further including a gate electrode G41, a gate insulating film GF41, $n^+$ type diffusion regions 4 and 12, and contact CT2.

$N^+$ type diffusion region 4 is formed in the surface of n-type diffusion region 2 at a distance from the main surface of $p^-$ type substrate 1 and p-type diffusion region 3. $N^+$ type diffusion region 4 has node N2 coupled to gate electrode G41. Namely, $n^+$ type diffusion region 4 is connected to gate electrode G41 through contact CT2.

It is noted that semiconductor device 110 may not include $n^+$ type diffusion region 4. In this case, n-type diffusion region 2 has node N2 coupled to power supply potential node NL1.

$N^+$ type diffusion region 12 is formed in the surface of p-type diffusion region 3 at a distance from the main surface of $p^-$ type substrate 1, n-type diffusion region 2, and $n^+$ type diffusion region 11. $N^+$ type diffusion region 12 has node N3 coupled to power supply potential node NL1 through contact CT1 and resistor R.

N-channel MOS transistor TR41 has gate electrode G41 formed on the surface of p-type diffusion region 3 with gate insulating film GF41 being interposed, the drain formed of $n^+$ type diffusion region 11, and the source formed of $n^+$ type diffusion region 12. Gate electrode G41 is provided, opposed to a channel region in p-type diffusion region 3 lying between $n^+$ type diffusion regions 11 and 12, with gate insulating film GF41 being interposed. N-channel MOS transistor TR41 supplies the charging current to capacitor C through n-type diffusion region 2.

Junction field-effect transistor TR42 has the gate formed of n-type diffusion region 2 and p-type diffusion region 3, the drain formed of n-type diffusion region 2 and coupled to gate electrode G41 through node N2, and the source formed of n-type diffusion region 2 and coupled to the first electrode of capacitor C through node N1.

Here, the drain of high-voltage side power semiconductor element TR101 is connected, for example, to a voltage of several hundred volts. In this case, potential Vs suddenly increases, for example, to several hundred volts in 1 microsecond in response to the switching operation of high-voltage side power semiconductor element TR101 and low-voltage side power semiconductor element TR102.

Accordingly, a displacement current flows through resistor R due to sudden increase in potential Vb and the potential of contact CT1 becomes significantly greater than power supply voltage Vcc. Then, as the forward bias voltage is applied to the pn junction formed by p-type diffusion region 3 and $n^+$ type diffusion region 11, the reverse current may flow from capacitor C to power supply potential node NL1.

In the semiconductor device according to Embodiment 10 of the present invention, however, if potential Vb rises and exceeds power supply voltage Vcc, the potential of contact CT2 rises until junction field-effect transistor TR42 pinches off When the potential of contact CT2, that is, the potential of gate electrode G41, exceeds the threshold voltage of N-channel MOS transistor TR41, N-channel MOS transistor TR41 turns on, and $n^+$ type diffusion region 11 and p-type diffusion region 3 are short-circuited through $n^+$ type diffusion region 12 and contact CT1. According to such a configuration, application of the forward bias voltage to the pn junction formed by p-type diffusion region 3 and $n^+$ type diffusion region 11 can be prevented, and therefore, the reverse current can be prevented from flowing from capacitor C to power supply potential node NL1.

As the configuration and the operation are otherwise the same as those of the semiconductor device according to Embodiment 8, detailed description will not be repeated here.

Therefore, in the semiconductor device according to Embodiment 10 of the present invention, as compared with semiconductor device 108 according to Embodiment 8 of the present invention, the resistance value of the current path from power supply potential node NL1 to capacitor C can further be lowered, and the charging current can efficiently be supplied to the charging-target element.

Another embodiment of the present invention will now be described with reference to the drawings. It is noted that the same or corresponding elements in the drawings have the same reference characters allotted, and description thereof will not be repeated.

Embodiment 11

The present embodiment relates to a semiconductor device different from the semiconductor device according to Embodiment 10 in additionally including a protection circuit. The semiconductor device in the present embodiment is the same as the semiconductor device according to Embodiment 10 except for the disclosure below.

Figure 16:
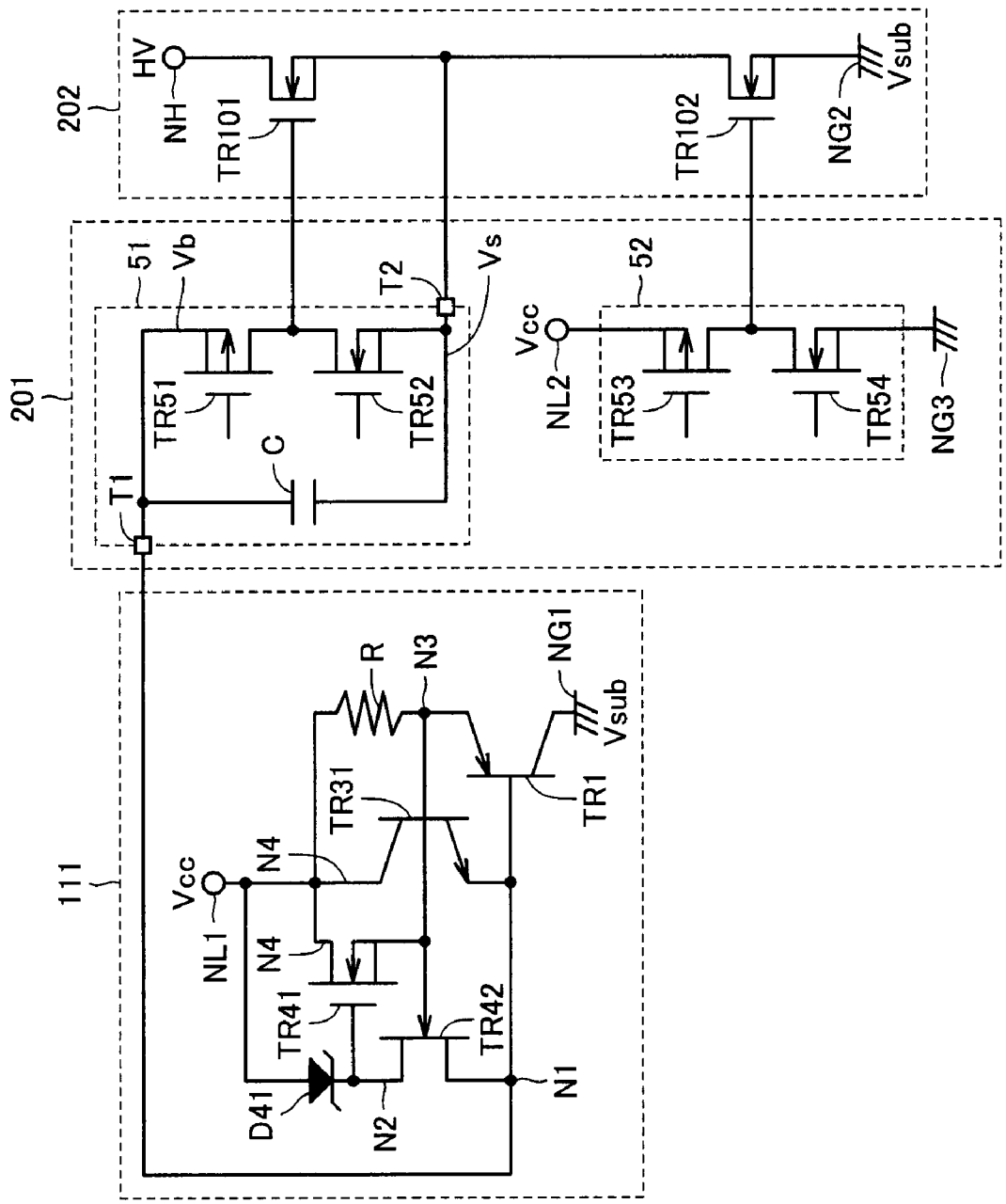
FIG. 16 is a circuit diagram showing a configuration of a semiconductor device according to Embodiment 11 of the present invention.

FIG. 16 is a circuit diagram showing a configuration of the semiconductor device according to Embodiment 11 of the present invention.

Referring to FIG. 16, a semiconductor device 111 is different from semiconductor device 110 according to Embodiment 10 of the present invention in further including a diode D41.

Diode D41 is a Zener diode, and has an anode connected to power supply potential node NL1, and a cathode connected to gate electrode G41. Diode D41 clamps an applied reverse voltage to a prescribed voltage value.

According to such a configuration, application of a transient overvoltage to gate electrode G41 of N-channel MOS transistor TR41 can be prevented, and gate breakdown of N-channel MOS transistor TR41 can be prevented.

As the configuration and the operation are otherwise the same as those of the semiconductor device according to Embodiment 10, detailed description will not be repeated here.

Therefore, in the semiconductor device according to Embodiment 11 of the present invention, the charging current can efficiently be supplied to the charging-target element, as in the semiconductor device according to Embodiment 10 of the present invention.

Another embodiment of the present invention will now be described with reference to the drawings. It is noted that the same or corresponding elements in the drawings have the same reference characters allotted, and description thereof will not be repeated.

Embodiment 12

The present embodiment relates to a semiconductor device different from the semiconductor device according to Embodiment 10 in additionally including a protection circuit. The semiconductor device in the present embodiment is the same as the semiconductor device according to Embodiment 10 except for the disclosure below.

Figure 17:
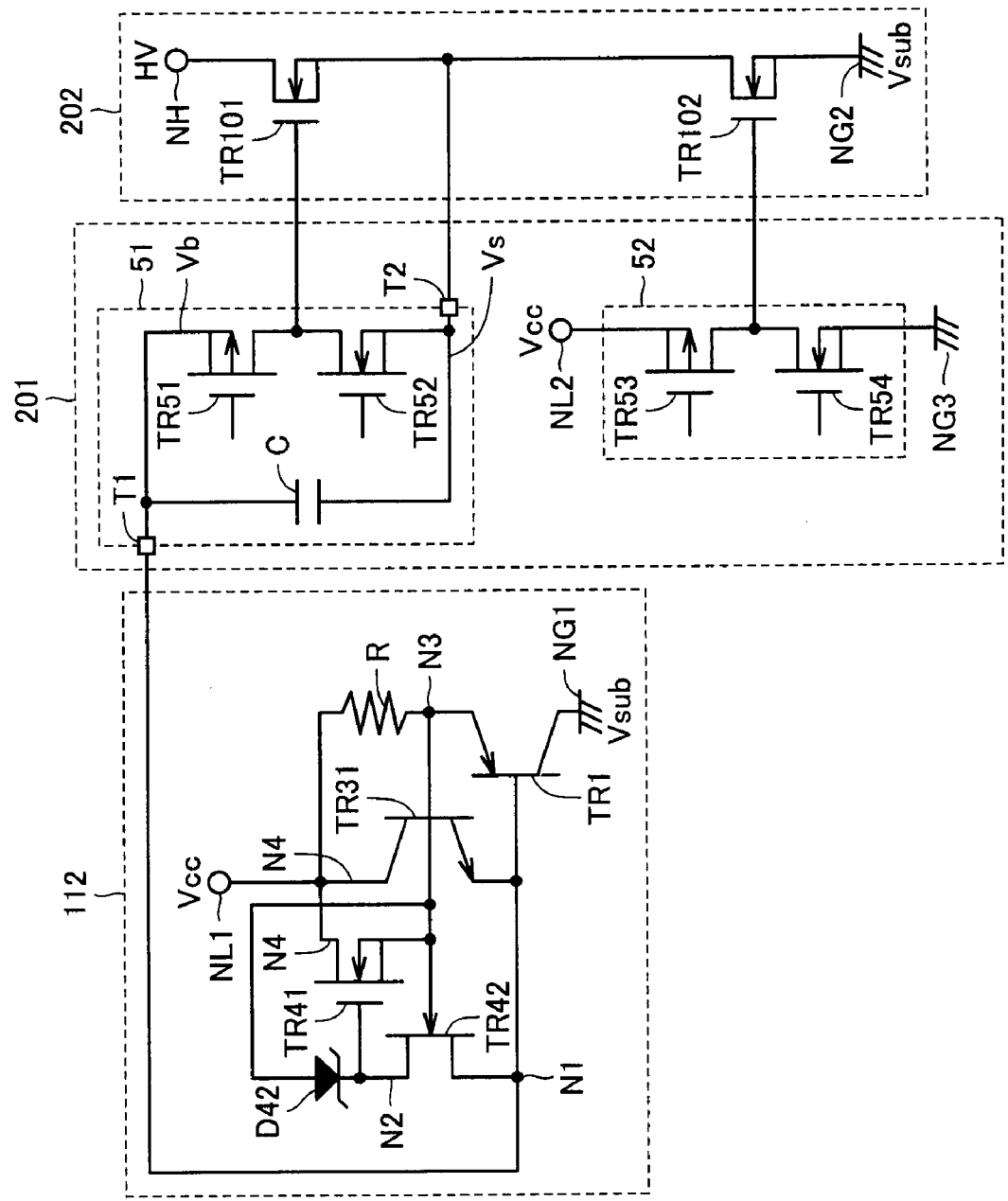
FIG. 17 is a circuit diagram showing a configuration of a semiconductor device according to Embodiment 12 of the present invention.

FIG. 17 is a circuit diagram showing a configuration of the semiconductor device according to Embodiment 12 of the present invention.

Referring to FIG. 17, a semiconductor device 112 is different from semiconductor device 110 according to Embodiment 10 of the present invention in further including a diode D42.

Diode D42 is a Zener diode, and has an anode connected to p-type diffusion region 3, that is, the second end of resistor R, and a cathode connected to gate electrode G41. Diode D42 clamps an applied reverse voltage to a prescribed voltage value.

According to such a configuration, application of a transient overvoltage to gate electrode G41 of N-channel MOS transistor TR41 can be prevented, and gate breakdown of N-channel MOS transistor TR41 can be prevented.

As the configuration and the operation are otherwise the same as those of the semiconductor device according to Embodiment 10, detailed description will not be repeated here.

Therefore, in the semiconductor device according to Embodiment 12 of the present invention, the charging current can efficiently be supplied to the charging-target element, as in the semiconductor device according to Embodiment 10 of the present invention.

Another embodiment of the present invention will now be described with reference to the drawings. It is noted that the same or corresponding elements in the drawings have the same reference characters allotted, and description thereof will not be repeated.

Embodiment 13

The present embodiment relates to a semiconductor device different from the semiconductor device according to Embodiment 10 in additionally including a protection circuit. The semiconductor device in the present embodiment is the same as the semiconductor device according to Embodiment 10 except for the disclosure below.

Figure 18:
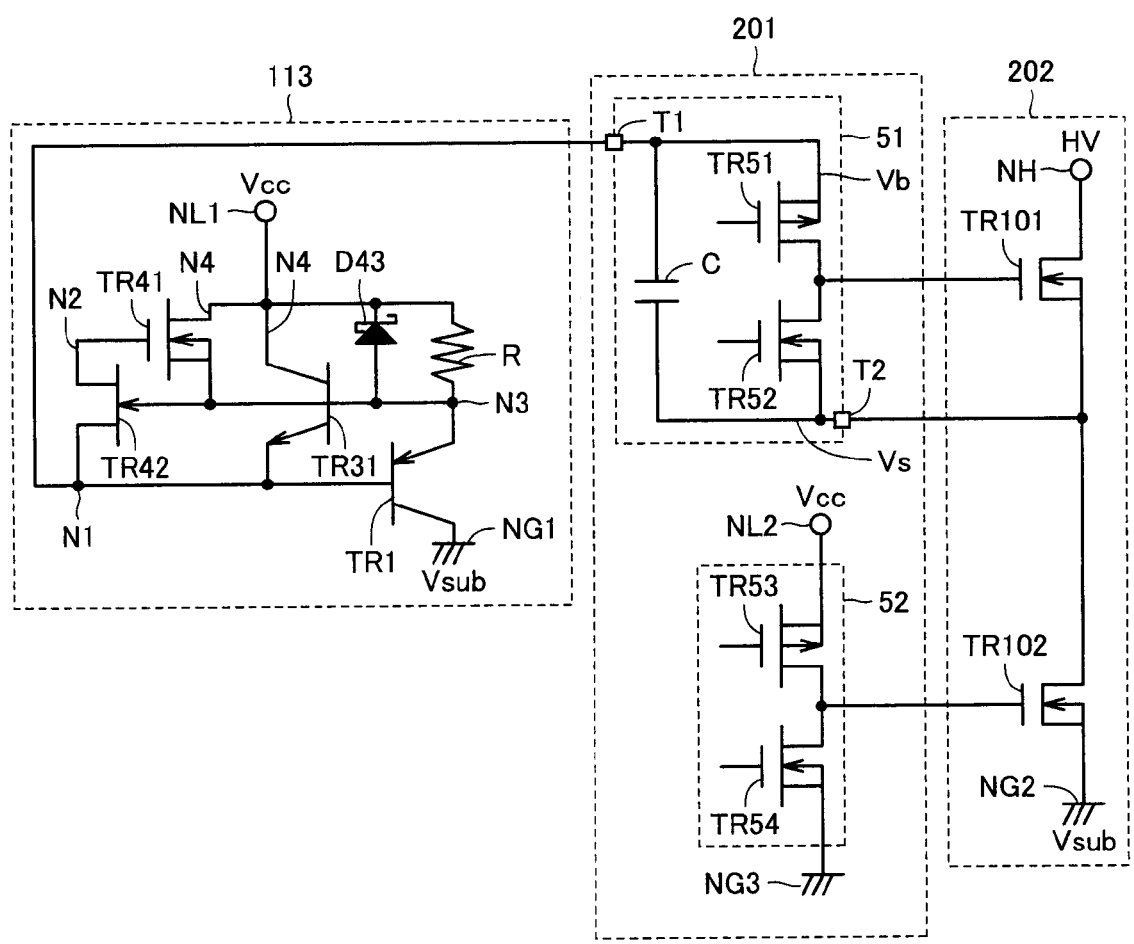
FIG. 18 is a circuit diagram showing a configuration of a semiconductor device according to Embodiment 13 of the present invention.

FIG. 18 is a circuit diagram showing a configuration of the semiconductor device according to Embodiment 13 of the present invention.

Referring to FIG. 18, a semiconductor device 113 is different from semiconductor device 110 according to Embodiment 10 of the present invention in further including a diode D43.

Diode D43 is a Schottky diode, and has an anode connected to p-type diffusion region 3, that is, the second end of resistor R, and a cathode connected to power supply potential node NL1. A forward voltage of diode D43 is smaller than the forward voltage of the pn junction formed by p-type diffusion region 3 and $n^+$ type diffusion region 11.

Here, the drain of high-voltage side power semiconductor element TR101 is connected, for example, to a voltage of several hundred volts. In this case, potential Vs suddenly increases, for example, to several hundred volts in 1 microsecond in response to the switching operation of high-voltage side power semiconductor element TR101 and low-voltage side power semiconductor element TR102.

Accordingly, a displacement current flows through resistor R due to sudden increase in potential Vb and the potential of contact CT1 becomes significantly greater than power supply voltage Vcc. Then, as the forward bias voltage is applied to the pn junction formed by p-type diffusion region 3 and $n^+$ type diffusion region 11, the reverse current may flow from capacitor C to power supply potential node NL1.

The semiconductor device according to Embodiment 13 of the present invention, however, includes diode D43 of which forward voltage is smaller than the forward voltage of the pn junction formed by p-type diffusion region 3 and $n^+$ type diffusion region 11. According to such a configuration, application of the forward bias voltage to the pn junction formed by p-type diffusion region 3 and $n^+$ type diffusion region 11 can be prevented, and therefore, the reverse current can be prevented from flowing from capacitor C to power supply potential node NL1.

As the configuration and the operation are otherwise the same as those of the semiconductor device according to Embodiment 10, detailed description will not be repeated here.

Therefore, in the semiconductor device according to Embodiment 13 of the present invention, the charging current can efficiently be supplied to the charging-target element, as in the semiconductor device according to Embodiment 10 of the present invention.

Another embodiment of the present invention will now be described with reference to the drawings. It is noted that the same or corresponding elements in the drawings have the same reference characters allotted, and description thereof will not be repeated.

Embodiment 14

The present embodiment relates to a semiconductor device different from the semiconductor device according to Embodiment 10 in additionally including a current path from power supply potential node NL1 to capacitor C. The semiconductor device in the present embodiment is the same as the semiconductor device according to Embodiment 10 except for the disclosure below.

Figure 19:
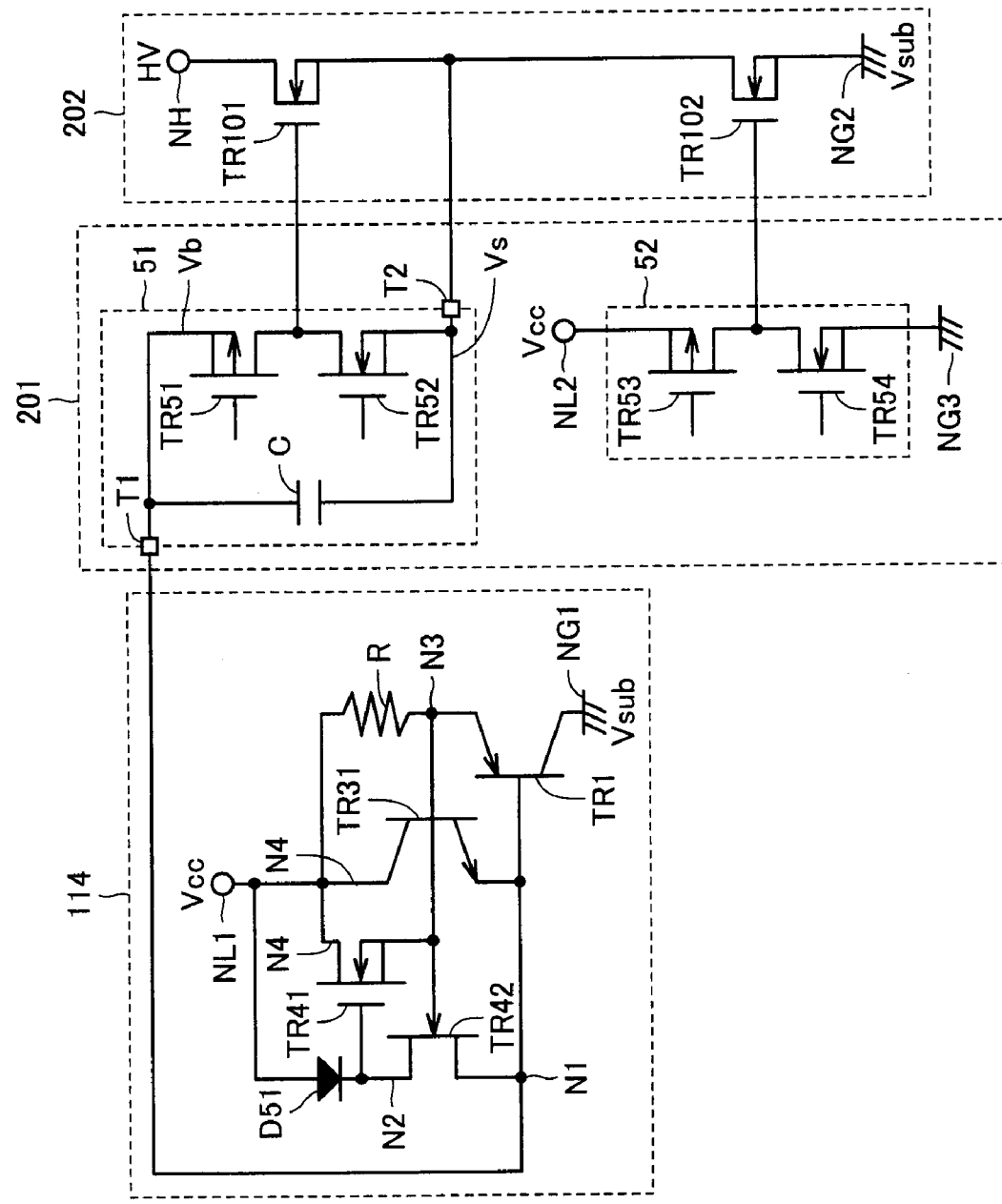
FIG. 19 is a circuit diagram showing a configuration of a semiconductor device according to Embodiment 14 of the present invention.
Figure 20:
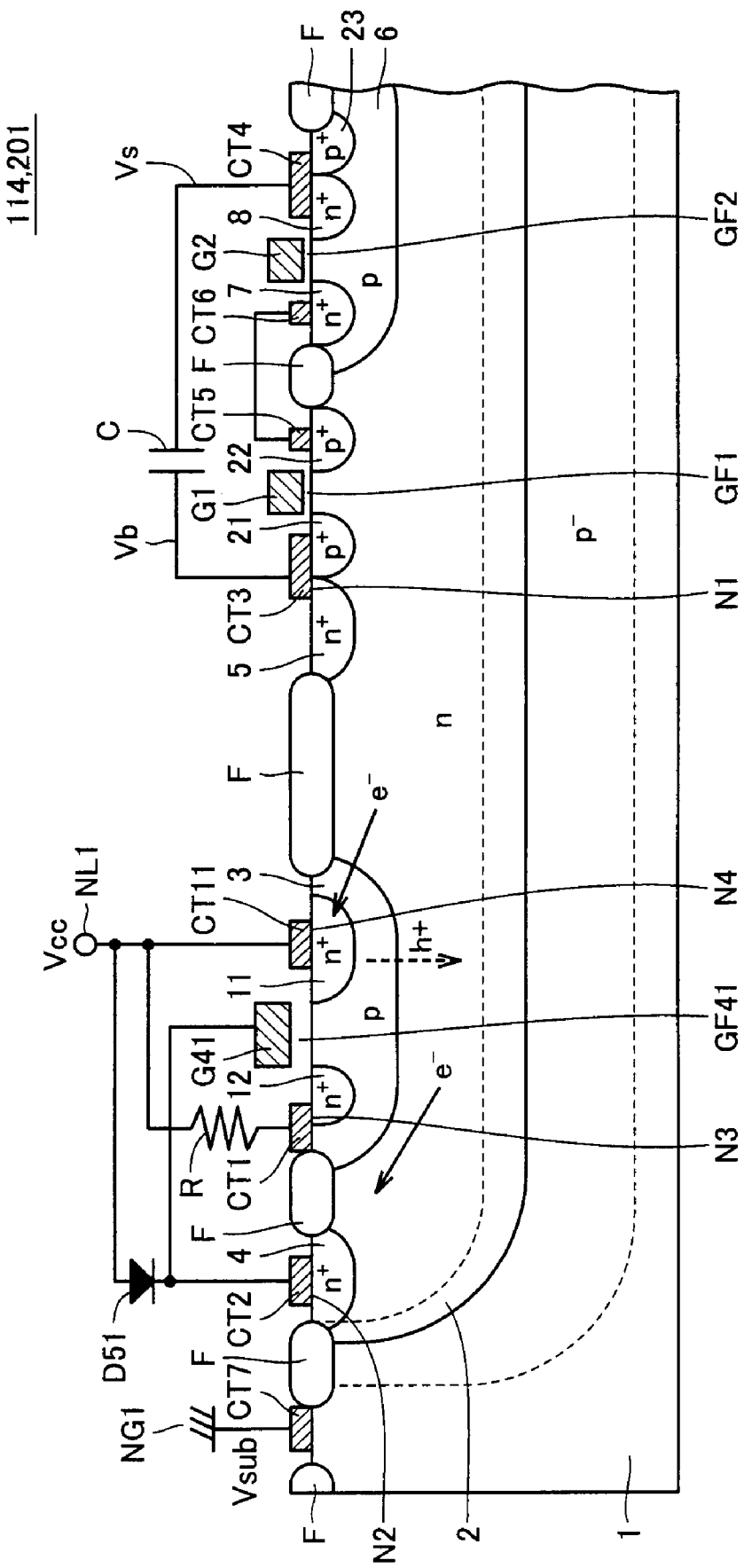
FIG. 20 is a cross-sectional view showing the configuration of the semiconductor device according to Embodiment 14 of the present invention.

FIG. 19 is a circuit diagram showing a configuration of the semiconductor device according to Embodiment 14 of the present invention. FIG. 20 is a cross-sectional view showing the configuration of the semiconductor device according to Embodiment 14 of the present invention.

Referring to FIGS. 19 and 20, a semiconductor device 114 is different from semiconductor device 110 according to Embodiment 10 of the present invention in further including a diode D51.

Diode D51 has an anode connected to power supply potential node NL1 and a cathode connected to contact CT2 and gate electrode G41.

As junction field-effect transistor TR42 has the drain connected to power supply potential node NL1 through diode D51, the charging current is supplied to capacitor C through n-type diffusion region 2.

According to such a configuration, the charging current supplied to capacitor C is implemented as the sum of the charging current from contact CT1 to capacitor C resulting from holes injected from p-type diffusion region 3 to n-type diffusion region 2, the charging current from contact CT11 to capacitor C supplied by NPN transistor TR31, and the charging current from contact CT2 to capacitor C supplied by junction field-effect transistor TR42.

As the configuration and the operation are otherwise the same as those of the semiconductor device according to Embodiment 10, detailed description will not be repeated here.

Therefore, in the semiconductor device according to Embodiment 14 of the present invention, as compared with semiconductor device 110 according to Embodiment 10 of the present invention, the resistance value of the current path from power supply potential node NL1 to capacitor C can further be lowered, and the charging current can efficiently be supplied to the charging-target element.

Another embodiment of the present invention will now be described with reference to the drawings. It is noted that the same or corresponding elements in the drawings have the same reference characters allotted, and description thereof will not be repeated.

Embodiment 15

The present embodiment relates to a semiconductor device different from the semiconductor device according to Embodiment 8 in additionally including a transistor. The semiconductor device in the present embodiment is the same as the semiconductor device according to Embodiment 8 except for the disclosure below.

Figure 21:
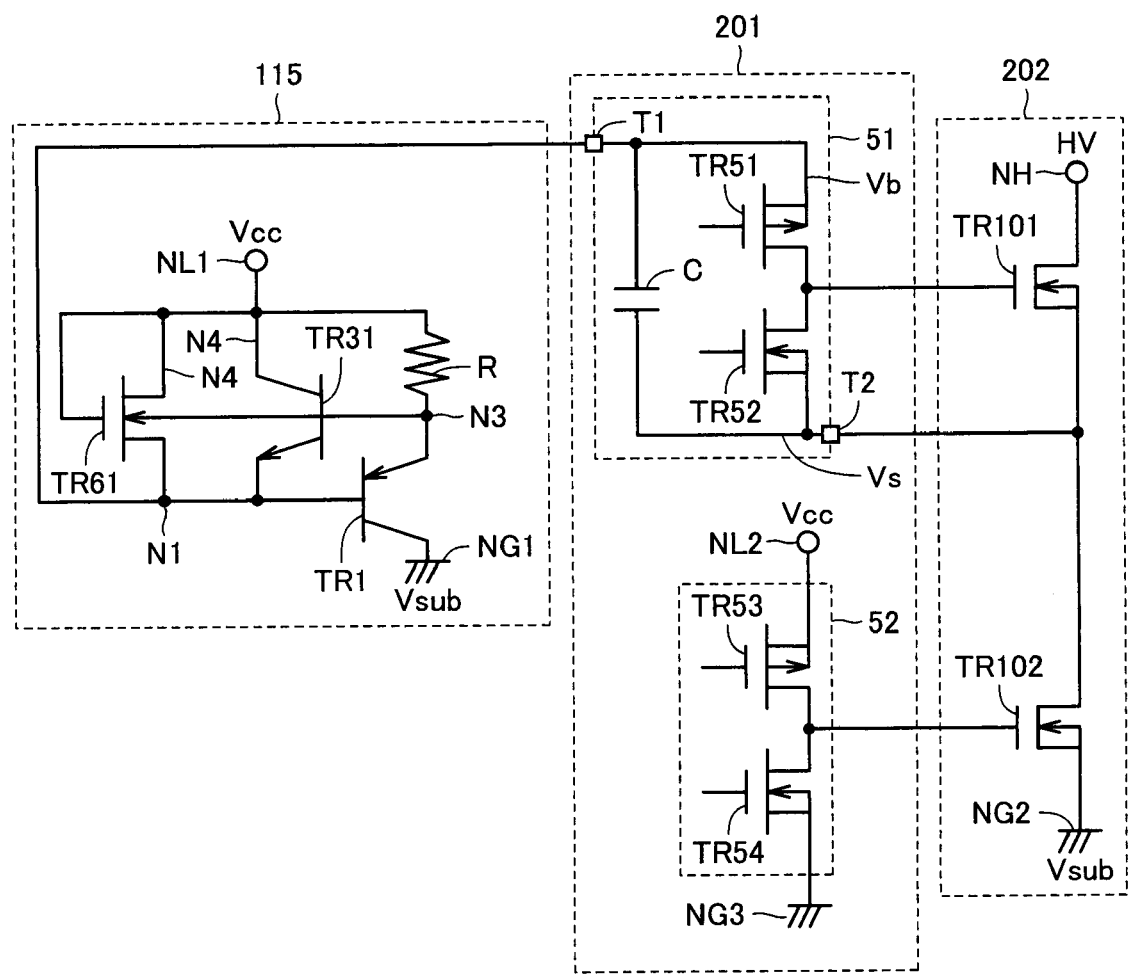
FIG. 21 is a circuit diagram showing a configuration of a semiconductor device according to Embodiment 15 of the present invention.

FIG. 21 is a circuit diagram showing a configuration of the semiconductor device according to Embodiment 15 of the present invention.

Referring to FIG. 21, a semiconductor device 115 is different from semiconductor device 108 according to Embodiment 8 of the present invention in further including an N-channel MOS transistor TR61.

N-channel MOS transistor TR61 has the drain connected to power supply potential node NL1, the source connected to the first electrode of capacitor C, and the gate connected to power supply potential node NL1.

Figure 22:
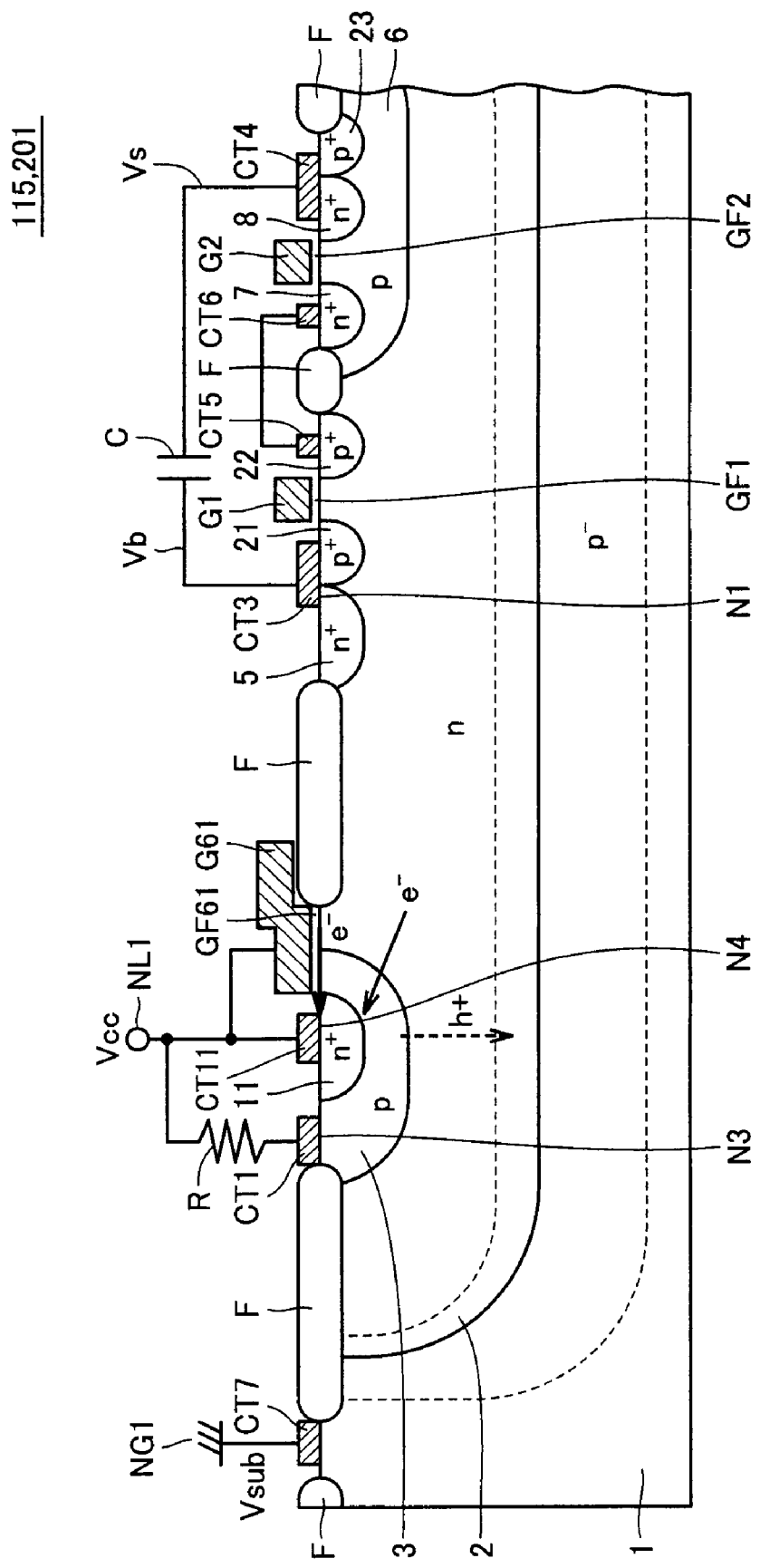
FIG. 22 is a cross-sectional view showing the configuration of the semiconductor device according to Embodiment 15 of the present invention.

FIG. 22 is a cross-sectional view showing the configuration of the semiconductor device according to Embodiment 15 of the present invention.

Referring to FIG. 22, semiconductor device 115 is different from semiconductor device 108 according to Embodiment 8 of the present invention in further including a gate electrode G61 and a gate insulating film GF61.

N-channel MOS transistor TR61 has gate electrode G61 formed on the surface of p-type diffusion region 3 with gate insulating film GF61 being interposed, the source formed of n-type diffusion region 2, and the drain formed of n$^+$ type diffusion region 11. Gate electrode G61 is provided, opposed to a channel region in p-type diffusion region 3 lying between n-type diffusion region 2 and n$^+$ type diffusion region 11, with gate insulating film GF61 being interposed. N-channel MOS transistor TR61 supplies the charging current to capacitor C through n-type diffusion region 2.

When potential Vb lowers and becomes lower than power supply voltage Vcc, a positive bias voltage is applied to gate electrode G61 by an amount of voltage lowering due to the current that flows through resistor R. When the positive bias voltage exceeds a threshold voltage of N-channel MOS transistor TR61, N-channel MOS transistor TR61 turns on, and N-channel MOS transistor TR61 supplies the charging current to capacitor C through n-type diffusion region 2.

According to such a configuration, the charging current supplied to capacitor C is implemented as the sum of the charging current from contact CT1 to capacitor C resulting from holes injected from p-type diffusion region 3 to n-type diffusion region 2, the charging current from contact CT11 to capacitor C supplied by NPN transistor TR31, and the charging current from contact CT11 to capacitor C supplied by N-channel MOS transistor TR61.

As the configuration and the operation are otherwise the same as those of the semiconductor device according to Embodiment 8, detailed description will not be repeated here.

Therefore, in the semiconductor device according to Embodiment 15 of the present invention, as compared with semiconductor device 108 according to Embodiment 8 of the present invention, the resistance value of the current path from power supply potential node NL1 to capacitor C can further be lowered, and the charging current can efficiently be supplied to the charging-target element.

Embodiment 16

The present embodiment relates to a semiconductor device different from the semiconductor device according to Embodiment 15 in additionally including a protection circuit. The semiconductor device in the present embodiment is the same as the semiconductor device according to Embodiment 15 except for the disclosure below.

Figure 23:
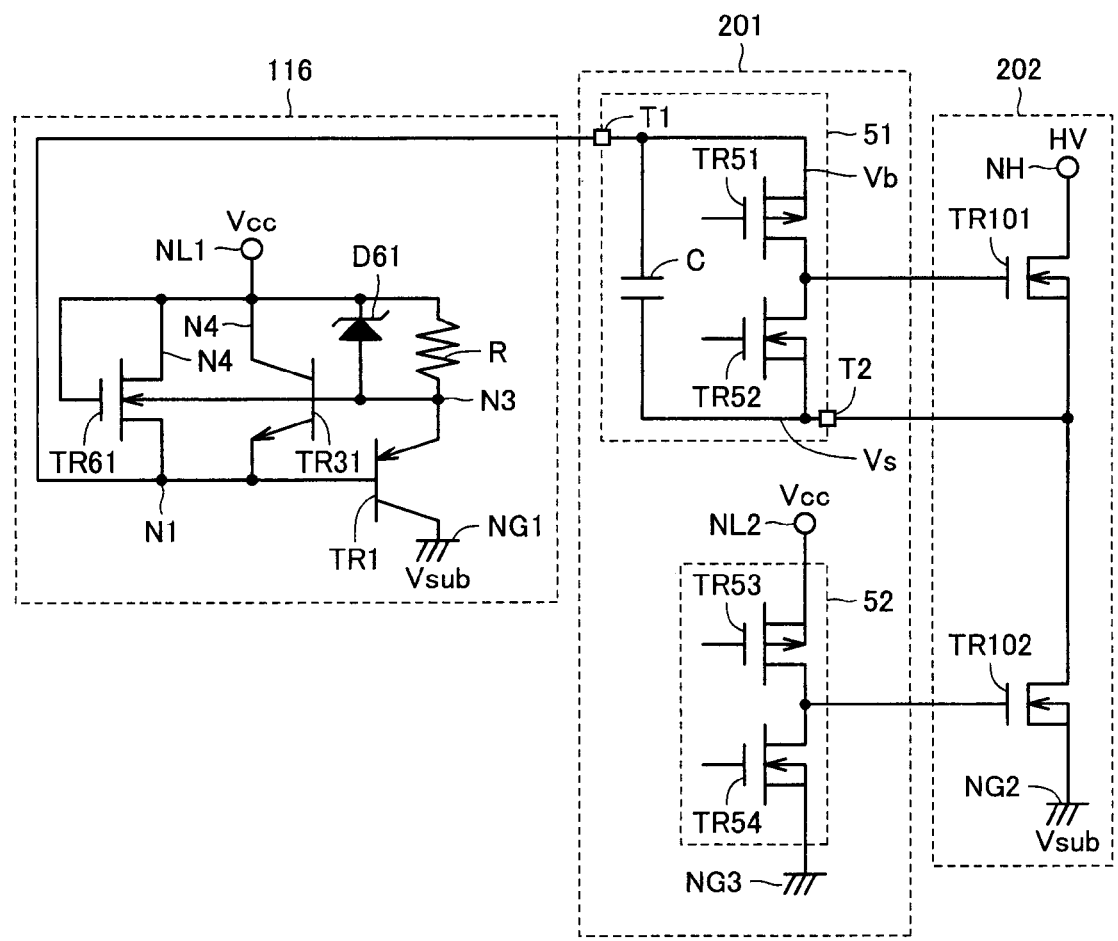
FIG. 23 is a circuit diagram showing a configuration of a semiconductor device according to Embodiment 16 of the present invention.

FIG. 23 is a circuit diagram showing a configuration of the semiconductor device according to Embodiment 16 of the present invention.

Referring to FIG. 23, a semiconductor device 116 is different from semiconductor device 115 according to Embodiment 15 of the present invention in further including a diode D61.

Diode D61 is a Zener diode, and has an anode connected to p-type diffusion region 3, that is, the second end of resistor R, and a cathode connected to power supply potential node NL1. Diode D61 clamps an applied reverse voltage to a prescribed voltage value.

According to such a configuration, application of a transient overvoltage to gate electrode G61 of N-channel MOS transistor TR61 can be prevented, and gate breakdown of N-channel MOS transistor TR61 can be prevented.

As the configuration and the operation are otherwise the same as those of the semiconductor device according to Embodiment 15, detailed description will not be repeated here.

Therefore, in the semiconductor device according to Embodiment 16 of the present invention, the charging current can efficiently be supplied to the charging-target element, as in the semiconductor device according to Embodiment 15 of the present invention.

Another embodiment of the present invention will now be described with reference to the drawings. It is noted that the same or corresponding elements in the drawings have the same reference characters allotted, and description thereof will not be repeated.

Embodiment 17

The present embodiment relates to a semiconductor device different from the semiconductor device according to Embodiment 16 in additionally including a protection circuit. The semiconductor device in the present embodiment is the same as the semiconductor device according to Embodiment 16 except for the disclosure below.

Figure 24:
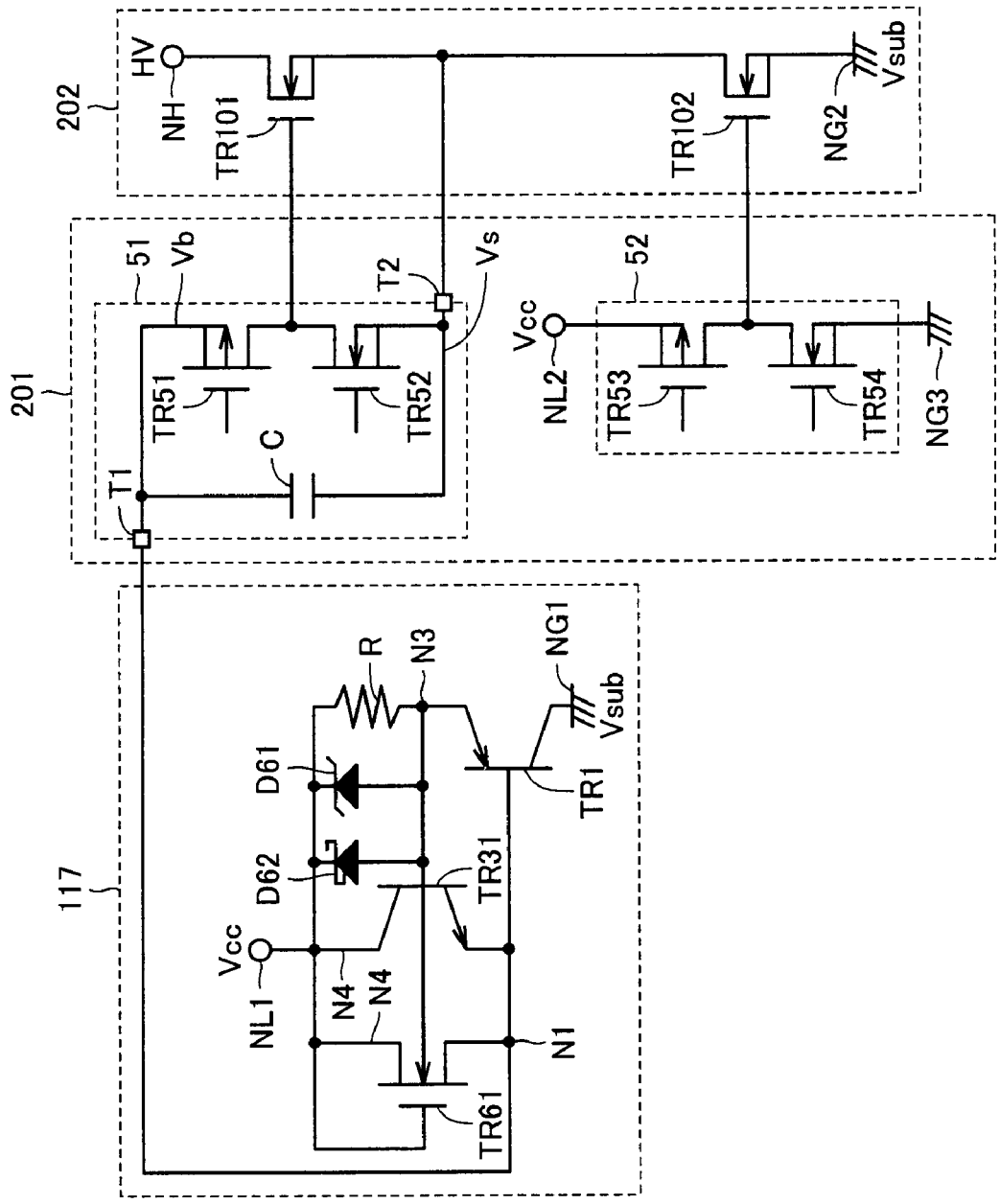
FIG. 24 is a circuit diagram showing a configuration of a semiconductor device according to Embodiment 17 of the present invention.

FIG. 24 is a circuit diagram showing a configuration of the semiconductor device according to Embodiment 17 of the present invention.

Referring to FIG. 24, a semiconductor device 117 is different from semiconductor device 116 according to Embodiment 16 of the present invention in further including a diode D62.

Diode D62 is a Schottky diode, and has an anode connected to p-type diffusion region 3, that is, the second end of resistor R, and a cathode connected to power supply potential node NL1. A forward voltage of diode D62 is smaller than the forward voltage of the pn junction formed by p-type diffusion region 3 and $n^+$ type diffusion region 11.

Here, the drain of high-voltage side power semiconductor element TR101 is connected, for example, to a voltage of several hundred volts. In this case, potential Vs suddenly increases, for example, to several hundred volts in 1 microsecond in response to the switching operation of high-voltage side power semiconductor element TR101 and low-voltage side power semiconductor element TR102.

Accordingly, a displacement current flows through resistor R due to sudden increase in potential Vb and the potential of contact CT1 becomes significantly greater than power supply voltage Vcc. Then, as the forward bias voltage is applied to the pn junction formed by p-type diffusion region 3 and $n^+$ type diffusion region 11, the reverse current may flow from capacitor C to power supply potential node NL1.

The semiconductor device according to Embodiment 17 of the present invention, however, includes diode D62 of which forward voltage is smaller than the forward voltage of the pn junction formed by p-type diffusion region 3 and $n^+$ type diffusion region 11. According to such a configuration, application of the forward bias voltage to the pn junction formed by p-type diffusion region 3 and $n^+$ type diffusion region 11 can be prevented, and therefore, the reverse current can be prevented from flowing from capacitor C to power supply potential node NL1.

As the configuration and the operation are otherwise the same as those of the semiconductor device according to Embodiment 16, detailed description will not be repeated here.

Therefore, in the semiconductor device according to Embodiment 17 of the present invention, the charging current can efficiently be supplied to the charging-target element, as in the semiconductor device according to Embodiment 16 of the present invention.

The semiconductor device according to Embodiment 17 of the present invention includes diodes D61 and D62 connected in parallel. Accordingly, gate breakdown of N-channel MOS transistor TR61 can be prevented and the reverse current can be prevented from flowing from capacitor C to power supply potential node NL1. This effect is also obtained in the semiconductor devices according to Embodiments 6, 7, 12, and 13 of the present invention.

Though the semiconductor devices according to Embodiments 1 to 17 of the present invention are configured to include resistor R, the present invention is not limited as such. If electrons that have flowed from n-type diffusion region 2 into p-type diffusion region 3 can be caused to reach contact CT1 by setting the impurity concentration of p-type diffusion region 3 to such a low level as $1 \times 10^{17}/cm^3$, an amount of holes injected from p-type diffusion region 3 to n-type diffusion region 2 can relatively be decreased. Accordingly, the semiconductor device may not include resistor R. If resistor R can be dispensed with, for example, diode D2 in semiconductor device 102 according to Embodiment 2 of the present invention is no longer necessary. Namely, even if the semiconductor device does not include diode D2, the potential of contact CT 1 can be prevented from exceeding power supply voltage Vcc, and avalanche between $n^+$ type diffusion region 4 and p-type diffusion region 3 can be prevented.

Another embodiment of the present invention will now be described with reference to the drawings. It is noted that the same or corresponding elements in the drawings have the same reference characters allotted, and description thereof will not be repeated.

Embodiment 18

The present embodiment relates to a semiconductor device different from the semiconductor device according to Embodiment 8 in not including n+ type diffusion region 11. The semiconductor device in the present embodiment is the same as the semiconductor device according to Embodiment 8 except for the disclosure below.

Figure 25:
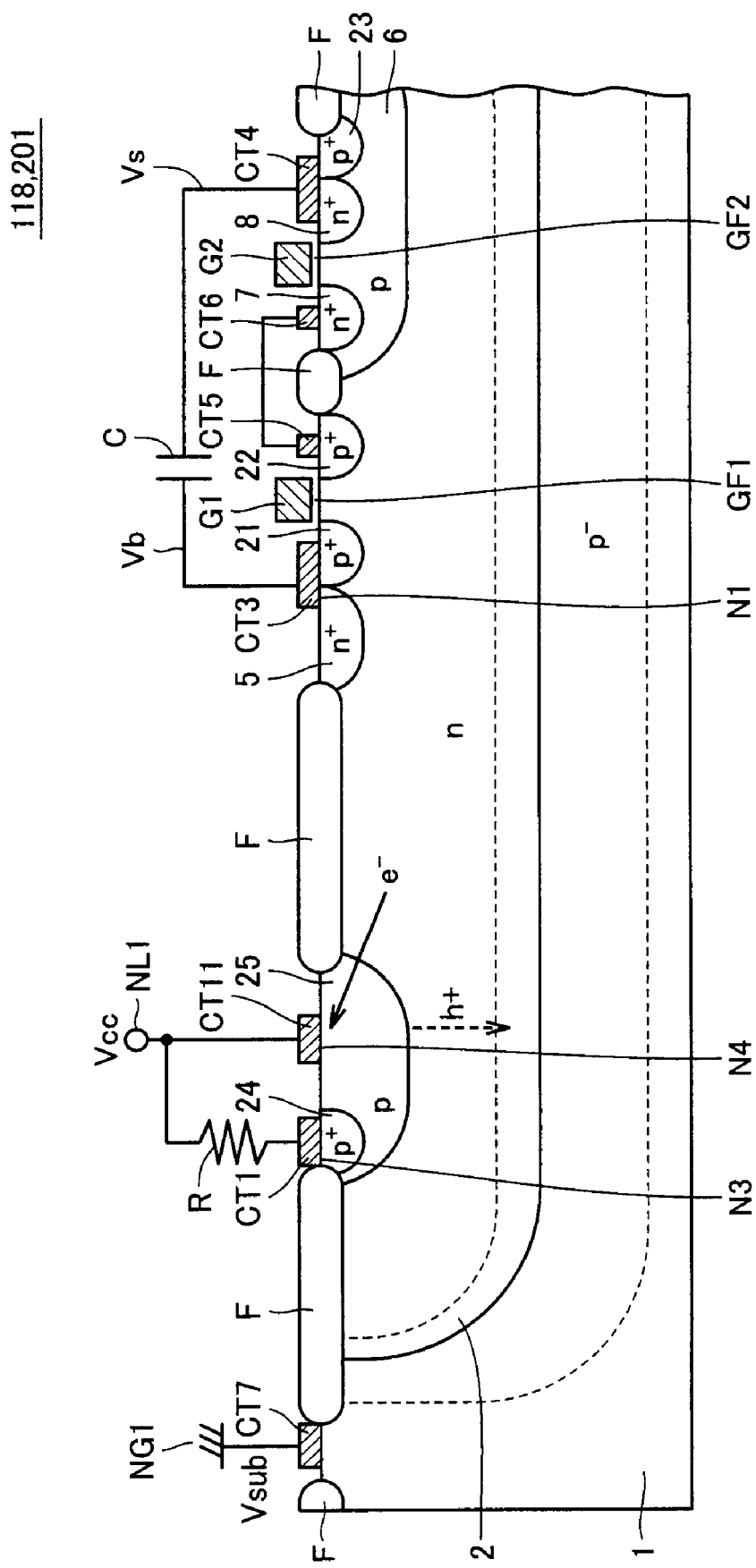
FIG. 25 is a cross-sectional view showing a configuration of a semiconductor device according to Embodiment 18 of the present invention.

FIG. 25 is a cross-sectional view showing a configuration of the semiconductor device according to Embodiment 18 of the present invention.

Referring to FIG. 25, a semiconductor device 118 is different from semiconductor device 108 according to Embodiment 8 of the present invention in that n+ type diffusion region 11 is not provided but a p+ type diffusion region (charge carrier drift restriction portion) 24 is provided and that a p-type diffusion region (charge carrier drift restriction portion) 25 is provided instead of p-type diffusion region 3.

P-type diffusion region 25 has an impurity concentration not larger than a prescribed value at which charge carrier is allowed to drift from n-type diffusion region 2 to node N4. For example, p-type diffusion region 25 has such a low impurity concentration as $1 \times 10^{17}/cm^3$. According to such a configuration, electrons that have flowed from n-type diffusion region 2 to p-type diffusion region 25 can reach contact CT11. Therefore, NPN transistor TR31 can be formed of p-type diffusion region 25 and n-type diffusion region 2. More specifically, NPN transistor TR31 has a base and a collector formed of p-type diffusion region 25 and an emitter formed of n-type diffusion region 2. NPN transistor TR31 supplies the charging current to capacitor C through n-type diffusion region 2.

Here, by allowing the electrons that have flowed from n-type diffusion region 2 to p-type diffusion region 25 to reach contact CT11, an amount of holes injected from power supply potential node NL1 to n-type diffusion region 2 through contact CT11 and p-type diffusion region 25 can relatively be decreased. Namely, without n+ type diffusion region 11, semiconductor device 118 can restrict the amount of holes injected from power supply node NL1 to n-type diffusion region 2 through contact CT11 and p-type diffusion region 25.

P+ type diffusion region 24 is formed in the surface of p-type diffusion region 25 at a distance from the main surface of p− type substrate 1 and n-type diffusion region 2. P-type diffusion region 25 is connected to contact CT1 through p+ type diffusion region 24. By thus providing p+ type diffusion region 24 having an impurity concentration higher than p-type diffusion region 25 between p-type diffusion region 25 and contact CT1, the electrons that have flowed from n-type diffusion region 2 into p-type diffusion region 25 can be prevented from reaching contact CT1.

Alternatively, by providing p+ type diffusion region 24 having an impurity concentration higher than p-type diffusion region 25 between p-type diffusion region 25 and contact CT1, the amount of holes injected from power supply potential node NL1 into n-type diffusion region 2 through contact CT1 and p-type diffusion region 25 can be restricted. Therefore, semiconductor device 118 may not include resistor R.

Even if semiconductor device 118 does not include p+ type diffusion region 24, by providing contact CT11, i.e., node N4, farther from contact CT3, i.e., node N1, relative to contact CT1, i.e., node N3, in the cross-section shown in FIG. 25 and by setting a distance between contacts CT1 and CT11 to at least a prescribed value, the electrons that have flowed from n-type diffusion region 2 into p-type diffusion region 25 can be prevented from reaching contact CT1 by means of the internal resistance of p-type diffusion region 25.

Here, the drain of high-voltage side power semiconductor element TR101 is connected, for example, to a voltage of several hundred volts. In this case, potential Vs suddenly increases, for example, to several hundred volts in 1 microsecond in response to the switching operation of high-voltage side power semiconductor element TR101 and low-voltage side power semiconductor element TR102.

Accordingly, a displacement current flows through resistor R due to sudden increase in potential Vb and the potential of contact CT1 becomes significantly greater than power supply voltage Vcc.

The semiconductor device according to Embodiment 18 of the present invention, however, does not include n+ type diffusion region 11. According to such a configuration, it is not necessary to provide a Schottky diode, for example, as in the semiconductor device according to Embodiment 9 of the present invention. Namely, as the pn junction is not formed between p-type diffusion region 25 and contact CT11 in the semiconductor device according to Embodiment 18 of the present invention, flow of the reverse current from capacitor C to power supply potential node NL1 can be prevented even if the potential of contact CT1 is significantly higher than power supply voltage Vcc.

If semiconductor device 118 does not include n+ type diffusion region 11, p-type diffusion region 25 has node N4 coupled to power supply potential node NL1.

As the configuration and the operation are otherwise the same as those of the semiconductor device according to Embodiment 8, detailed description will not be repeated here.

Therefore, in the semiconductor device according to Embodiment 18 of the present invention, the charging current can efficiently be supplied to the charging-target element, as in the semiconductor device according to Embodiment 8 of the present invention.

Though the semiconductor devices according to Embodiments 1 to 18 of the present invention are configured to include resistor R, the present invention is not limited as such. If the amount of holes injected from p-type diffusion region 3 into n-type diffusion region 2 can be restricted by means of electric resistance of p-type diffusion region 3, the semiconductor device may not include resistor R. For example, in the cross-sectional view in FIG. 2, by setting a longer length of p-type diffusion region 3 in the vertical direction in the sheet or a smaller width of p-type diffusion region 3 in the direction perpendicular to the sheet surface, the electric resistance of a current path from p-type diffusion region 3 to p− type substrate 1 can be increased. More specifically, for example, by setting a length of p-type diffusion region 3 in the direction of stack of n-type diffusion region 2 and p-type diffusion region 3 to a value not smaller than a prescribed value or by setting a width of p-type diffusion region 3 in the direction of stack of n-type diffusion region 2 and p-type diffusion region 3 to a value not larger than a prescribed value in the cross-sectional view shown in FIG. 2, the electric resistance of a current path from p-type diffusion region 3 to p− type substrate 1 can be increased.

Another embodiment of the present invention will now be described with reference to the drawings. It is noted that the same or corresponding elements in the drawings have the same reference characters allotted, and description thereof will not be repeated.

Embodiment 19

The present embodiment relates to a semiconductor device different from the semiconductor device according to Embodiment 10 in not including resistor R.

Figure 26:
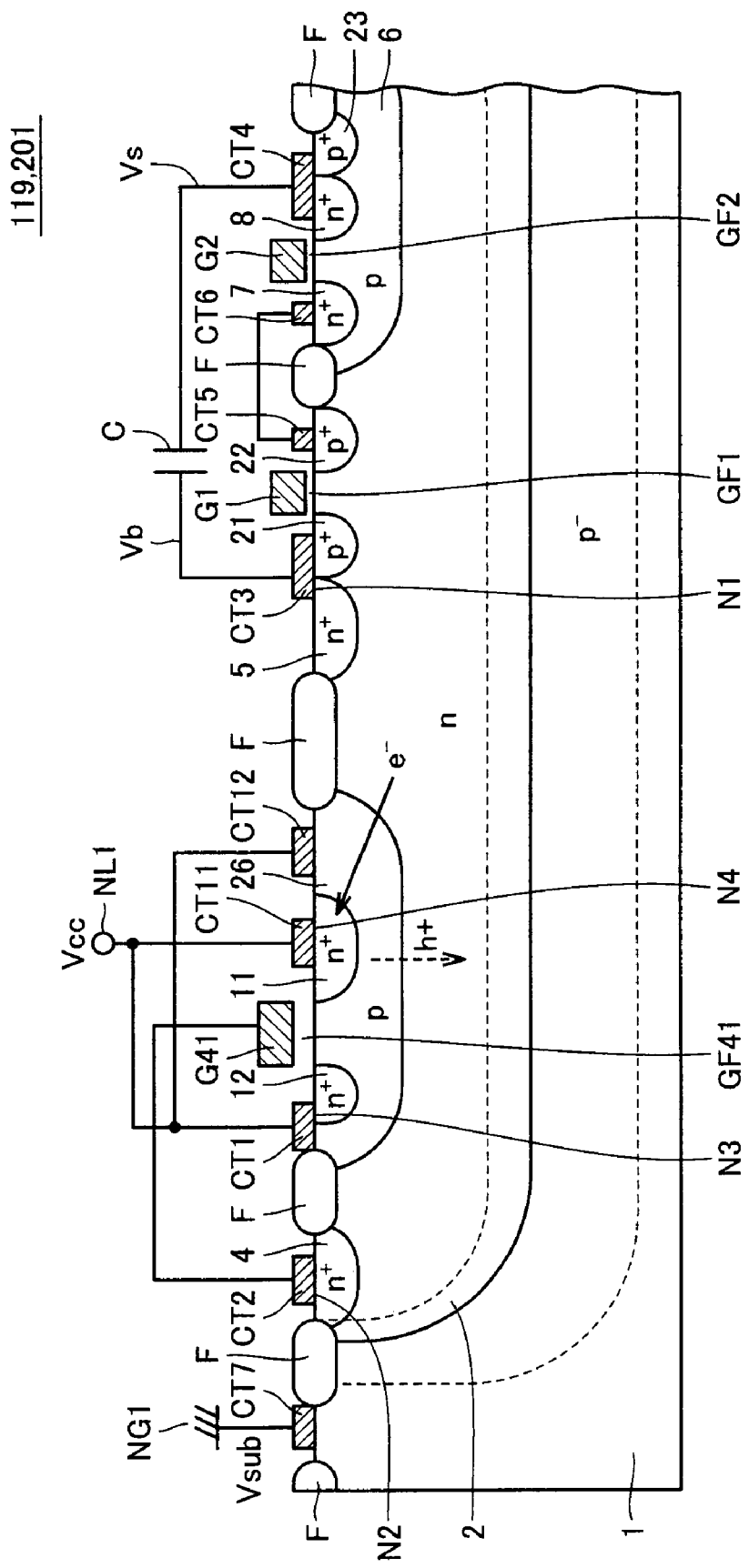
FIG. 26 is a cross-sectional view showing a configuration of a semiconductor device according to Embodiment 19 of the present invention.

FIG. 26 is a cross-sectional view showing a configuration of the semiconductor device according to Embodiment 19 of the present invention.

Referring to FIG. 26, a semiconductor device 119 is different from semiconductor device 110 according to Embodiment 10 of the present invention in that resistor R is not included, a p-type diffusion region 26 is included instead of p-type diffusion region 3, and a contact CT12 is further included.

P-type diffusion region 26 has electric resistance capable of restricting an amount of holes injected from p-type diffusion region 26 to n-type diffusion region 2. For example, as described previously, by setting a length of p-type diffusion region 26 in the direction of stack of n-type diffusion region 2 and p-type diffusion region 26 to a value not smaller than a prescribed value or by setting a width of p-type diffusion region 26 in the direction of stack of n-type diffusion region 2 and p-type diffusion region 26 to a value not larger than a prescribed value in the cross-sectional view shown in FIG. 26, the electric resistance of a current path from p-type diffusion region 26 to p⁻ type substrate 1 can be increased. According to such a configuration, power loss of the power supply supplying power supply voltage Vcc can be reduced.

In addition, by providing n⁺ type diffusion region 11 and n⁺ type diffusion region 12 at a distance from each other by at least a prescribed length, the internal resistance of p-type diffusion region 26 serves in place of resistor R between the drain and the source of N-channel MOS transistor TR41 in semiconductor device 110.

Contact CT12 is connected to p-type diffusion region 26, and provided at a position in proximity to n⁺ type diffusion region 11. Contact CT12 is provided, opposed to contact CT1 connected to n⁺ type diffusion region 12, with contact CT11 connected to n⁺ type diffusion region 11 lying therebetween. According to such a configuration, the internal resistance of p-type diffusion region 26 can be short-circuited when N-channel MOS transistor TR41 is turned on.

As the configuration and the operation are otherwise the same as those of the semiconductor device according to Embodiment 10, detailed description will not be repeated here.

Therefore, in the semiconductor device according to Embodiment 19 of the present invention, the charging current can efficiently be supplied to the charging-target element, as in the semiconductor device according to Embodiment 10 of the present invention.

Another embodiment of the present invention will now be described with reference to the drawings. It is noted that the same or corresponding elements in the drawings have the same reference characters allotted, and description thereof will not be repeated.

Embodiment 20

The present embodiment relates to a semiconductor device different from the semiconductor device according to Embodiment 1 in not including resistor R.

Figure 27:
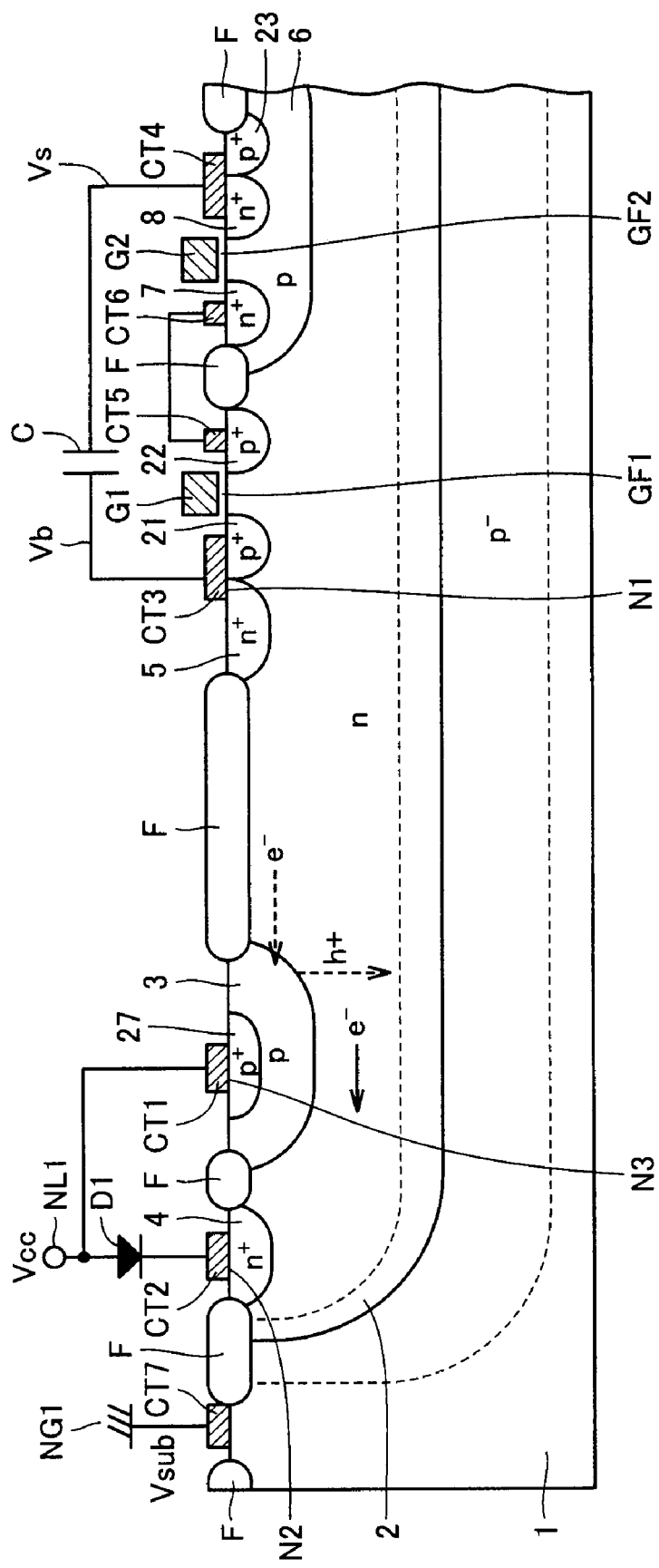
FIG. 27 is a cross-sectional view showing a configuration of a semiconductor device according to Embodiment 20 of the present invention.

FIG. 27 is a cross-sectional view showing a configuration of the semiconductor device according to Embodiment 20 of the present invention.

Referring to FIG. 27, a semiconductor device 120 is different from semiconductor device 101 according to Embodiment 1 of the present invention in that resistor R is not included but a p⁺ type diffusion region (charge carrier drift restriction portion) 27 is further included.

P⁺ type diffusion region 27 is formed in the surface of p-type diffusion region 3 at a distance from the main surface of p⁻ type substrate 1 and n-type diffusion region 2. P-type diffusion region 3 is connected to contact CT1 through p⁺ type diffusion region 27. By thus arranging p⁺ type diffusion region 27 having an impurity concentration higher than p-type diffusion region 25 between p-type diffusion region 3 and contact CT1, an amount of holes injected from power supply potential node NL1 into n-type diffusion region 2 through contact CT1 and p-type diffusion region 3 can be restricted.

As the configuration and the operation are otherwise the same as those of the semiconductor device according to Embodiment 1, detailed description will not be repeated here.

Therefore, in the semiconductor device according to Embodiment 20 of the present invention, the charging current can efficiently be supplied to the charging-target element, as in the semiconductor device according to Embodiment 1 of the present invention.

Though semiconductor device 120 according to Embodiment 20 of the present invention includes p⁺ type diffusion region 27, the present invention is not limited as such. Even if semiconductor device 120 does not include p⁺ type diffusion region 27, by providing a p-type diffusion region lower in impurity concentration, for example, of $1 \times 10^{17}/cm^3$ instead of p-type diffusion region 3, the electrons that have flowed from n-type diffusion region 2 to the p-type diffusion region are allowed to reach contact CT1. Therefore, an amount of holes injected from power supply potential node NL1 into n-type diffusion region 2 through contact CT1 and the p-type diffusion region can relatively be decreased.

Meanwhile, though the semiconductor devices according to Embodiments 1 to 20 of the present invention have such cross-sectional structures as shown in respective corresponding cross-sectional views, the present invention is not limited as such. Conductivity types of semiconductor layers and semiconductor regions, namely, p-type and n-type, may be reversed. In such a case, for example, in the semiconductor device according to Embodiment 1 of the present invention, power supply voltage Vcc is a negative voltage, the cathode of diode D1 is connected to power supply potential node NL1, and the anode is connected to contact CT2.

In addition, though the semiconductor devices according to Embodiments 1 to 20 of the present invention have such cross-sectional structures as shown in respective corresponding cross-sectional views, the present invention is not limited as such. Each diffusion region may be stacked in the horizontal direction or the semiconductor device may be configured with discrete parts.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device supplying a charging current to a charging-target element, comprising:
    a semiconductor layer of a first conductivity type;
    a first semiconductor region of a second conductivity type formed on a main surface of said semiconductor layer and having a first node coupled to a first electrode of said charging-target element;
    a second semiconductor region of the first conductivity type formed in a surface of said first semiconductor region at a distance from said semiconductor layer, and having a third node and a fourth node coupled to a power supply potential node supplied with a power supply voltage; and
    a charge carrier drift restriction portion of the second conductivity type including a region having conductivity extending into the second semiconductor region, and restricting drift of charge carrier from said third node and said fourth node to said semiconductor layer when forward bias is applied across the first semiconductor region and the second semiconductor region.

2. The semiconductor device according to claim 1, wherein said charge carrier drift restriction portion includes a resistor connected between said power supply potential node and said third node.

3. The semiconductor device according to claim 1, wherein said charge carrier drift restriction portion includes a semiconductor region of the first conductivity type formed in a surface of said second semiconductor region at a distance from said first semiconductor region, having said third node, and having an impurity concentration higher than said second semiconductor region.

4. The semiconductor device according to claim 1, wherein said charge carrier drift restriction portion includes said second semiconductor region, and
said second semiconductor region has an impurity concentration equal to or lower than a prescribed value, at which charge carrier is allowed to drift from said first semiconductor region to said fourth node.

5. The semiconductor device according to claim 1, wherein said charge carrier drift restriction portion includes said second semiconductor region, and
said second semiconductor region has a length in a direction of stack of said first semiconductor region and said second semiconductor region equal to or greater than a prescribed value or has a width in the direction of stack of said first semiconductor region and said second semiconductor region equal to or smaller than a prescribed value.

6. The semiconductor device according to claim 1, wherein said charge carrier drift restriction portion includes a fourth semiconductor region of the second conductivity type formed in a surface of said second semiconductor region at a distance from said first semiconductor region, and having said fourth node.

7. The semiconductor device according to claim 6, further comprising a diode having an electrode of the first conductivity type coupled to said second semiconductor region and an electrode of the second conductivity type coupled to said power supply potential node, and of which forward voltage is smaller than a forward voltage between said second semiconductor region and said fourth semiconductor region.

8. The semiconductor device according to claim 1, further comprising:
a first transistor having a first conducting electrode formed of said semiconductor layer, a control electrode formed of said first semiconductor region, and a second conducting electrode formed of said second semiconductor region; and
a second transistor having a first conducting electrode formed of said first semiconductor region and a control electrode and a second conducting electrode formed of said second semiconductor region.

9. The semiconductor device according to claim 8, wherein said first semiconductor region further includes a second node,
said semiconductor device further comprises:
a third semiconductor region of the second conductivity type having said third node and formed in a surface of said second semiconductor region at a distance from said first semiconductor region;
a fourth semiconductor region of the second conductivity type having said fourth node and formed in the surface of said second semiconductor region at a distance from said first semiconductor region and said third semiconductor region;
a third transistor having a control electrode formed on the surface of said second semiconductor region with an insulating film being interposed, and coupled to said second node, a first conducting electrode formed of said third semiconductor region, and a second conducting electrode formed of said fourth semiconductor region; and
a fourth transistor having a control electrode formed of said first semiconductor region and said second semiconductor region and a first conducting electrode and a second conducting electrode formed of said first semiconductor region.

10. The semiconductor device according to claim 9, wherein
said charge carrier drift restriction portion includes a resistor connected between said power supply potential node, and said second semiconductor region and said third semiconductor region.

11. The semiconductor device according to claim 9, further comprising a diode having an electrode of the first conductivity type coupled to said power supply potential node and an electrode of the second conductivity type coupled to the control electrode of said third transistor, and clamping an applied reverse voltage to a prescribed voltage value.

12. The semiconductor device according to claim 9, further comprising a diode having an electrode of the first conductivity type coupled to said second semiconductor region and an electrode of the second conductivity type coupled to the control electrode of said third transistor, and clamping an applied reverse voltage to a prescribed voltage value.

13. The semiconductor device according to claim 9, further comprising a diode having an electrode of the first conductivity type coupled to said second semiconductor region and an electrode of the second conductivity type coupled to said power supply potential node, and of which forward voltage is smaller than a forward voltage between said second semiconductor region and said fourth semiconductor region.

14. The semiconductor device according to claim 9, wherein
said third transistor has the control electrode further coupled to said power supply potential node.

15. The semiconductor device according to claim 9, further comprising a diode having an electrode of the first conductivity type coupled to said power supply potential node and an electrode of the second conductivity type coupled to the control electrode of said third transistor.

16. The semiconductor device according to claim 9, further comprising a fifth transistor having a control electrode formed on the surface of said second semiconductor region with an insulating film being interposed, and coupled to said power supply potential node, a first conducting electrode formed of said first semiconductor region, and a second conducting electrode formed of said fourth semiconductor region.

17. The semiconductor device according to claim 16, further comprising a diode having an electrode of the first conductivity type coupled to said second semiconductor region and an electrode of the second conductivity type coupled to the control electrode of said third transistor, and clamping an applied reverse voltage to a prescribed voltage value.

18. The semiconductor device according to claim 16, further comprising a diode having an electrode of the first conductivity type coupled to said second semiconductor region and an electrode of the second conductivity type coupled to the control electrode of said third transistor, and of which forward voltage is smaller than a forward voltage between said second semiconductor region and said fourth semiconductor region.

19. The semiconductor device according to claim 1, wherein said charging-target element has the first electrode connected to a power supply voltage terminal of a drive circuit supplying a voltage to a control electrode of a high-voltage side power semiconductor element out of the high-voltage side power semiconductor element and a low-voltage side power semiconductor element connected in series, said charging-target element has a second electrode connected to a reference voltage terminal of said drive circuit, and said drive circuit has the reference voltage terminal connected to a connection point of said high-voltage side power semiconductor element and said low-voltage side power semiconductor element.

* * * * *